United States Patent [19]
Fukushima et al.

[11] Patent Number: 5,654,913
[45] Date of Patent: Aug. 5, 1997

[54] APPARATUS AND METHOD FOR EXTENDING DATA RETENTION TIME OF SEMICONDUCTOR STORAGE CIRCUIT

[75] Inventors: Tetsuyuki Fukushima, Hyogo; Hiroyuki Yamauchi; Toru Iwata, both of Osaka, all of Japan

[73] Assignee: Matsushita Electric Industrial Co., Ltd, Osaka, Japan

[21] Appl. No.: 597,250

[22] Filed: Feb. 6, 1996

[30] Foreign Application Priority Data

Feb. 8, 1995 [JP] Japan ................................. 7-020149

[51] Int. Cl.$^6$ ........................................................ G11C 11/24
[52] U.S. Cl. ........................ 365/149; 365/222; 365/228; 365/230.06
[58] Field of Search ..................................... 365/149, 222, 365/189.09, 189.11, 228, 230.06

[56] References Cited

U.S. PATENT DOCUMENTS 5,253,205 10/1993 Eaton, Jr. ................................. 365/149
5,488,587 1/1996 Fukumoto ................................ 365/228

FOREIGN PATENT DOCUMENTS 4-179164 6/1992 Japan.
5-291534 11/1993 Japan.
6-11156 4/1994 Japan.

*Primary Examiner*—Tan T. Nguyen
*Attorney, Agent, or Firm*—McDermott, Will & Emery

[57] ABSTRACT

In halt period during standby time, a cell plate node potential switching circuit changes the potential of a cell plate node to a low potential that is lower than a high potential adopted in a burst refresh operation. As a result, a potential difference between both ends of a PN junction of a memory cell transistor is decreased, thereby suppressing a leakage current flowing through the PN junction. Simultaneously, a word driver circuit changes the potential of a word line to a negative potential that is lower than a normal potential adopted in the burst refresh operation. As a result, an off state of the memory cell transistor is enhanced owing to decrease of a gate-source voltage thereof, thereby suppressing a leakage current flowing from the bit line to a charge storage node. Accordingly, a leakage current flowing through the PN junction of the memory cell transistor and a leakage current flowing from the bit line through the memory cell transistor to the charge storage node are both suppressed during the standby time. Thus, a refresh interval is elongated so as to decrease power consumption.

24 Claims, 28 Drawing Sheets

APPARATUS AND METHOD FOR EXTENDING DATA RETENTION TIME OF SEMICONDUCTOR STORAGE CIRCUIT

BACKGROUND OF THE INVENTION

The present invention relates to an improved apparatus and method for extending data retention time of a semiconductor storage circuit comprising a DRAM (dynamic random access memory).

Recently more and more information equipment have been developed as portable equipment driven by an internal battery. In such portable equipment, it is desired to further decrease power consumption of a semiconductor storage circuit, that is, one of the internal elements of the portable equipment, so as to extend the time for driving the internal elements by the internal battery.

A DRAM included in the semiconductor storage circuit requires a periodic refresh operation for recovering the original state of stored charge even when the DRAM is not operated, i.e., it is in the standby state, because a stored data, i.e., the stored charge, leaks owing to its structural characteristic. When the interval of the refresh operation can be set longer, the amount of a current consumed in the standby state can be decreased and the lifetime of the internal battery of the portable equipment can be elongated.

Now, the configuration of the main part of a DRAM and the leakage path of the stored charge therein will be described.

FIG. 25 shows the main part configuration of a DRAM. In FIG. 25, a reference character "a" denotes a memory cell and a reference character "b" denotes a memory cell array including a large number of memory cells (a). Each memory cell (a) includes a memory cell transistor (c) and a memory cell capacitor (d). The memory cell transistor (c) is connected to a word driver circuit (e) through a word line WL at its gate electrode G and is also connected to a sense amplifier (f) through a bit line BL at its first electrode (q). A second electrode (t) of the memory cell transistor (c) is connected to one electrode of the memory cell capacitor (d), thereby forming a charge storage node (j). The charge storage node (j) stores charge of a predetermined potential VSN as a data. For example, when a data is at a high level, the charge storage node (j) is charged to a voltage VSN equal to a voltage Vcc (wherein the voltage Vcc is a supply voltage of, for example, 3.6 V), and when a data is at a low level, the node is charged to a voltage VSN of 0 V. The other electrode of the memory cell capacitor (d) is connected to a cell plate node (g), to which a predetermined cell plate node potential Vcp (for example, of 1.8 V) is applied by a memory cell plate potential generating circuit (h). A substrate node (i) of the memory cell transistor (c) is supplied with a predetermined substrate node potential VBB (for example, of −1.5 V).

FIG. 27 shows the charge leakage path from the memory cell transistor (c). The memory cell transistor (c) shown in this figure is formed as an N-channel MOS transistor. As is shown in FIG. 27, the charge storage node (j) is connected to the substrate node (i) via a PN junction (k) formed between a P-type substrate and an N-type diffused layer of the memory cell transistor (c). Therefore, when the charge storage node (j) stores a high data (VSN=3.6 V), the stored charge leaks via the PN junction (k) to the P-type substrate and flows to the substrate node (i) (VBB=−1.5 V). Additionally, in the case where the memory cell transistor (c) is in an off state, when the potential of the first electrode (q) is lower than that of the second electrode (t), the first electrode (q) works as a source and the second electrode (t) works as a drain, thereby forming a charge leakage path Lp1 from the second electrode (t) to the first electrode (q). When the potential of the second electrode (t) is lower, the second electrode (t) works as a source and the first electrode (q) works as a drain, thereby forming a charge leakage path Lp2 from the first electrode (q) to the second electrode (t). Therefore, when the charge storage node (j) stores a high data (VSN=3.6 V), the stored charge leaks from the second electrode (t) through the leakage path Lp1 to the first electrode (q). When the charge storage node (j) stores a low data (VSN=0 V), the charge of the first electrode (q) flows through the leakage path Lp2 to the second electrode (t). Accordingly, when, for example, a high data is stored as is shown in FIG. 26, after refreshing a predetermined one of the memory cells, it is necessary to perform the next refresh operation of that memory cell before the potential VSN of the charge storage node (j) of that memory cell decreases to a limit potential Vlim ("H") for reading a high data. When the decreasing rate of the potential VSN of the charge storage node is smaller (namely, when the charge leakage amount from the charge storage node (j) is smaller), the refresh interval can be set longer and the amount of a current consumed in the standby state can be decreased.

The charge leakage amount from the charge storage node (j) varies in the respective memory cells. Therefore, the refresh interval is generally set sufficiently long for a memory cell having the largest leakage amount.

As a countermeasure, it is possible to replace a defective memory cell having a large leakage amount with a good memory cell having a small leakage amount in the memory cell array (b). However, when a DRAM has a large capacity, the number of defective memory cells therein is increased. Therefore, the replacement of all the defective memory cells with redundant memory cells cannot be a practical countermeasure in view of the increase of a redundant area.

In the conventional technique disclosed in, for example, Japanese Laid-Open Patent Publications Nos. 4-179164 and 5-291534, the potential of the charge storage node (j) is recovered to its original value priorly to the operation of the DRAM even when the potential is varied owing to the charge leakage via the PN junction. This technique is based on passive concept that the charge leakage is to be tolerated. In contrast, for example, Japanese Laid-Open Patent Publication No. 6-111567 (Conventional Example 1) discloses an active technique to limit the leakage amount, in which a potential difference between the both ends of the PN junction is suppressed, thereby suppressing the leakage current flowing through the PN junction. This publication describes a method to suppress the potential difference at the PN junction as follows: The potential of the cell plate node (g) is lowered, thereby decreasing the potential of the charge storage node (j) due to capacity coupling of the memory cell capacitor (d). Thus, a potential difference between the charge storage node (j) and the substrate node (i) (that is, the potential difference at the PN junction) is minimized.

Furthermore, "A 34ns 256 Mb DRAM with Boosted Sense-Ground Scheme" (1994, IEEE International Solid-State Circuits Conference/SESSION 8/DRAMS AND NON-VOLATILE MEMORIES/PAPER TA8.2) (Conventional Example 2) discloses a technique to suppress a leakage current (off current) flowing between the drain and the source of the memory cell transistor (c) in an off state. In this technique, at the standby time when the potential of the word line is "0", the potential of the bit line BL is set to be slightly higher than "0". Since the potential of the bit line BL is thus set at the standby time, a potential difference Vgs between the gate and the source of the memory cell transistor (c) (Vgs=a gate potential Vg−a source potential Vs) becomes a negative potential when the first electrode (q) (which is connected to the bit line BL) of the memory cell transistor (c) works as a source. This enhances the off state of the memory cell transistor (c), thereby effectively decreasing the amount of the off current flowing from the charge storage node (j) through the memory cell transistor (c) to the bit line BL.

However, when both the leakage current through the PN junction and the off current through the memory cell transistor (c) are to be actively decreased, a combination of Conventional Examples 1 and 2 leads to the following problem:

In Conventional Example 1, when the charge storage node (j) stores a low data (VSN=0 V), the potential of the node (j) is decreased to be negative in accordance with the potential decrease of the cell plate node (g) at the standby time. At this point, since the second electrode (t) (which is connected to the charge storage node (j)) of the memory cell transistor (c) works as a source and the gate-source voltage Vgs becomes positive, the memory cell transistor (c) is turned on. As a result, a current flows from the bit line BL through the memory cell transistor (c) to the charge storage node (j), thereby increasing the potential of the charge storage node (j). Thus, the low data is destroyed. Such a problem does not occur when the charge storage node (j) stores a high data. When the data is at a high level, the first electrode (q) (which is connected to the bit line BL) of the memory cell transistor (c) works as a source, and hence, the configuration of Conventional Example 2 exhibits its effect. As a result, the off state of the memory cell transistor (c) is enhanced, thereby suppressing the off current flowing from the charge storage node (j) through the memory cell transistor (c) to the bit line BL. Thus, the high data stored in the charge storage node (j) can be successfully retained.

In addition, the technique of Conventional Example 2 can be more effective than the technique of Conventional Example 1 in some cases. When a transistor having an SOI (silicon on insulator) structure is adopted as a memory cell transistor as is shown in FIG. 16, an insulator is disposed between a P-type substrate and two electrodes. Therefore, no PN junction exists in such a case, and hence, there is no need to pay attention to a leakage current through the PN junction. Furthermore, when a memory cell transistor is refined, voltage resistance of a gate oxide film is decreased, and hence it is necessary to set low a voltage to be applied thereto. This results in the decrease of a threshold voltage of the memory cell transistor, and an off current flowing through the memory cell transistor can be estimated to be large. In such a case, it is important to suppress the off current flowing through the memory cell transistor by means of the technique of Conventional Example 2, but there can be a case where Conventional Example 2 cannot be applied for the following reason: When the respective memory cells (a) are intensively refreshed during the standby time, there exists a halt period when no refresh operation is conducted. In the halt period, the bit line BL is generally precharged to a supply voltage or an intermediate potential (a potential of ½ of the supply voltage). In this case, it is impossible to adopt the technique of Conventional Example 2, in which the potential of the bit line is set to be slightly higher than 0 with the potential of the word line being 0. In this case, when the charge storage node (j) stores a low data, the second electrode (t) (which is connected to the charge storage node (j)) of the memory cell transistor (c) works as a source, and hence, the memory cell transistor (c) is turned on. As a result, a current flows from the bit line BL through the memory cell transistor (c) to the charge storage node (j), which can disadvantageously destroy the low data.

A DRAM includes memory cells storing low data as well as those storing high data. Therefore, it is impossible to suppress the leakage current through the PN junction or the off current through the memory cell transistor by these conventional technique without destroying the data.

The present invention was devised to overcome the aforementioned problems, and its object is to suppress a leakage current through a PN junction or an off current through a memory cell transistor without destroying a low or high data stored in each charge storage node, so as to extend the data retention time. Thus, a refresh interval can be set longer and current consumption of an internal battery of portable equipment can be decreased.

SUMMARY OF THE INVENTION

An object of the present invention is to enhance an off state of a memory cell transistor in the case where a leakage current is suppressed by minimizing a potential difference at a PN junction, so as to prevent charge from flowing through the memory cell transistor.

Another object is to prevent charge from flowing through a memory cell transistor in a halt period in the case where a transistor having the SOI structure is used as a memory cell transistor.

These objects and other features and advantages of the invention will more fully appear from the following detailed description when the same is read in connection with the accompanying drawings.

BRIEF DESCRIPTION OF THE DRAWINGS

Preferred embodiments of the present invention are illustrated in the accompanying drawings in which.

DETAILED DESCRIPTION OF THE INVENTION

Preferred embodiments of the present invention will now be described referring to the accompanying drawings.

(Embodiment 1)

Figure 1:
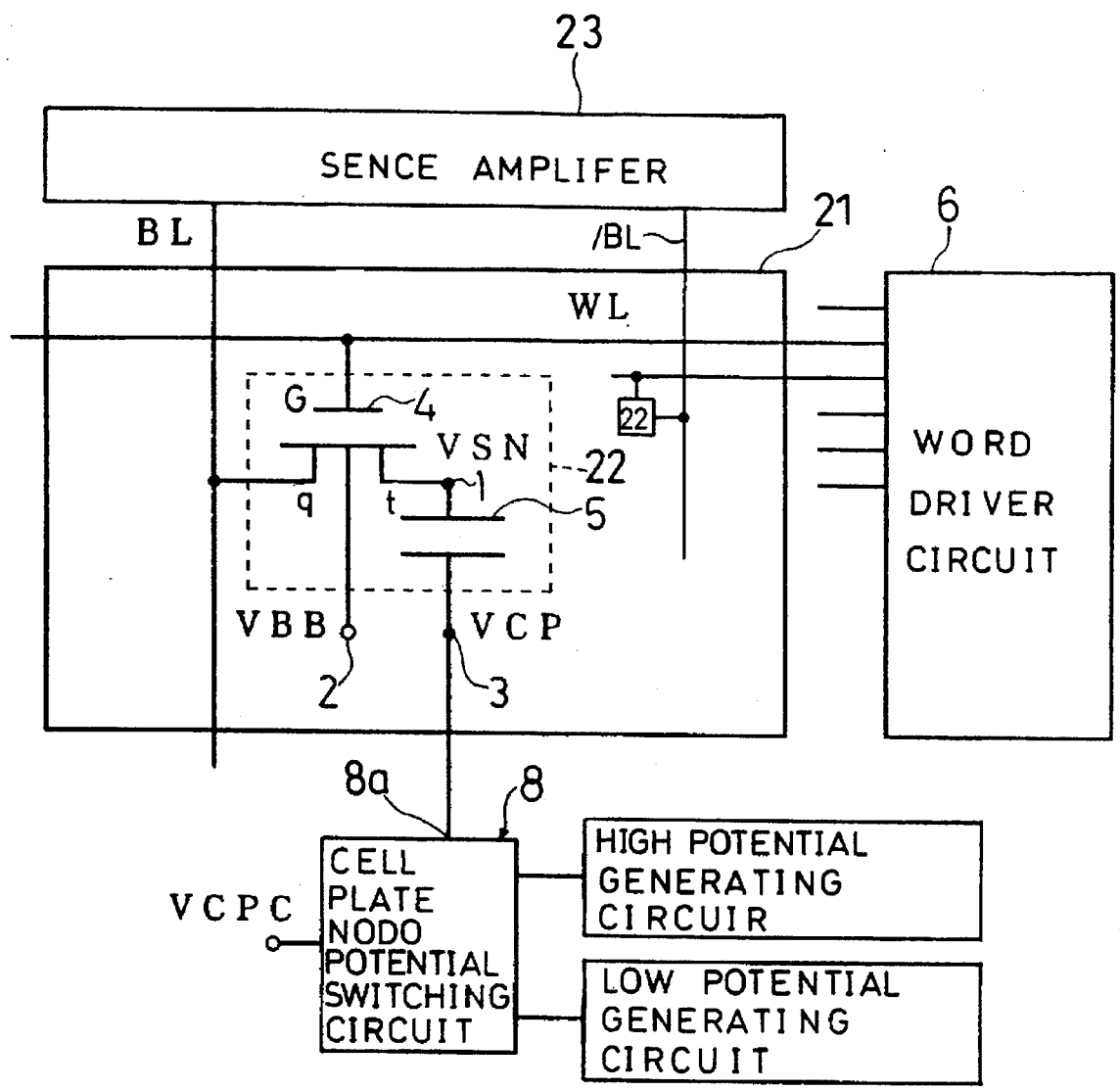
FIG. 1 is a schematic diagram showing the entire configuration of a DRAM according to Embodiment 1 of the invention.

FIG. 1 shows the entire configuration of a DRAM according to Embodiment 1 of the invention. In the DRAM of FIG. 1, a reference numeral 21 denotes a memory cell array, in which a large number of memory cells 22 are included (merely one of which is shown in FIG. 1). The memory cell 22 includes an NMOS memory cell transistor 4 and a memory cell capacitor 5. The DRAM includes a pair of bit lines BL and /BL, and a word line WL. A reference numeral 6 denotes a word driver circuit for driving the word line WL. A reference numeral 23 denotes a sense amplifier for amplifying a potential difference between the bit lines BL and /BL.

Figure 3:
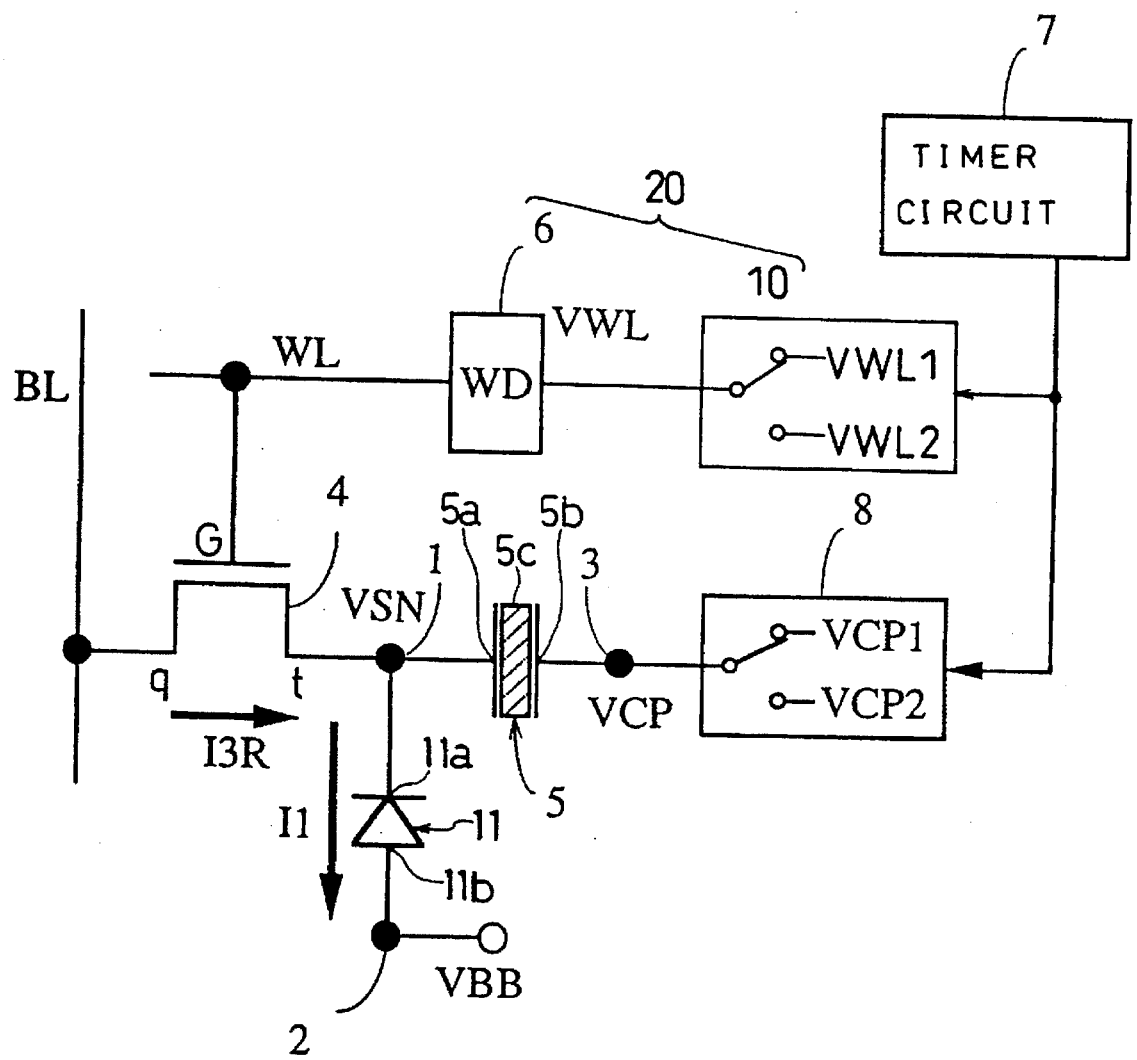
FIG. 3 is a circuit diagram of an equivalent circuit in the main part of the DRAM of Embodiment 1.

The memory cell capacitor 5 includes, as is shown in FIG. 3, a first electrode 5a, a second electrode 5b and an insulating film 5c sandwiched between the first and second electrodes 5a and 5b.

The memory cell transistor 4 is connected to the word line WL at its gate electrode (control electrode) G and is also connected to the bit line BL at its first electrode (q). A substrate node 2 of the memory cell transistor 4 is supplied with a predetermined substrate node potential VBB (for example, of −1.5 V). A second electrode (t) of the memory cell transistor 4 is connected to the first electrode 5a of the memory cell capacitor 5, and a node therebetween works as a charge storage node 1. The charge storage node 1 stores charge of a predetermined potential VSN equal to 0 V as a low data or charge of a predetermined potential VSN equal to a supply voltage Vcc (for example, of 3.6 V) as a high data.

The second electrode 5b of the memory cell capacitor 5 is connected to a cell plate node 3 of the memory cell 22. The cell plate node 3 is connected to an output terminal 8a of a cell plate node potential switching circuit (cell plate potential switching circuit) 8 for supplying the node 3 with a cell plate node potential Vcp.

Figure 2:
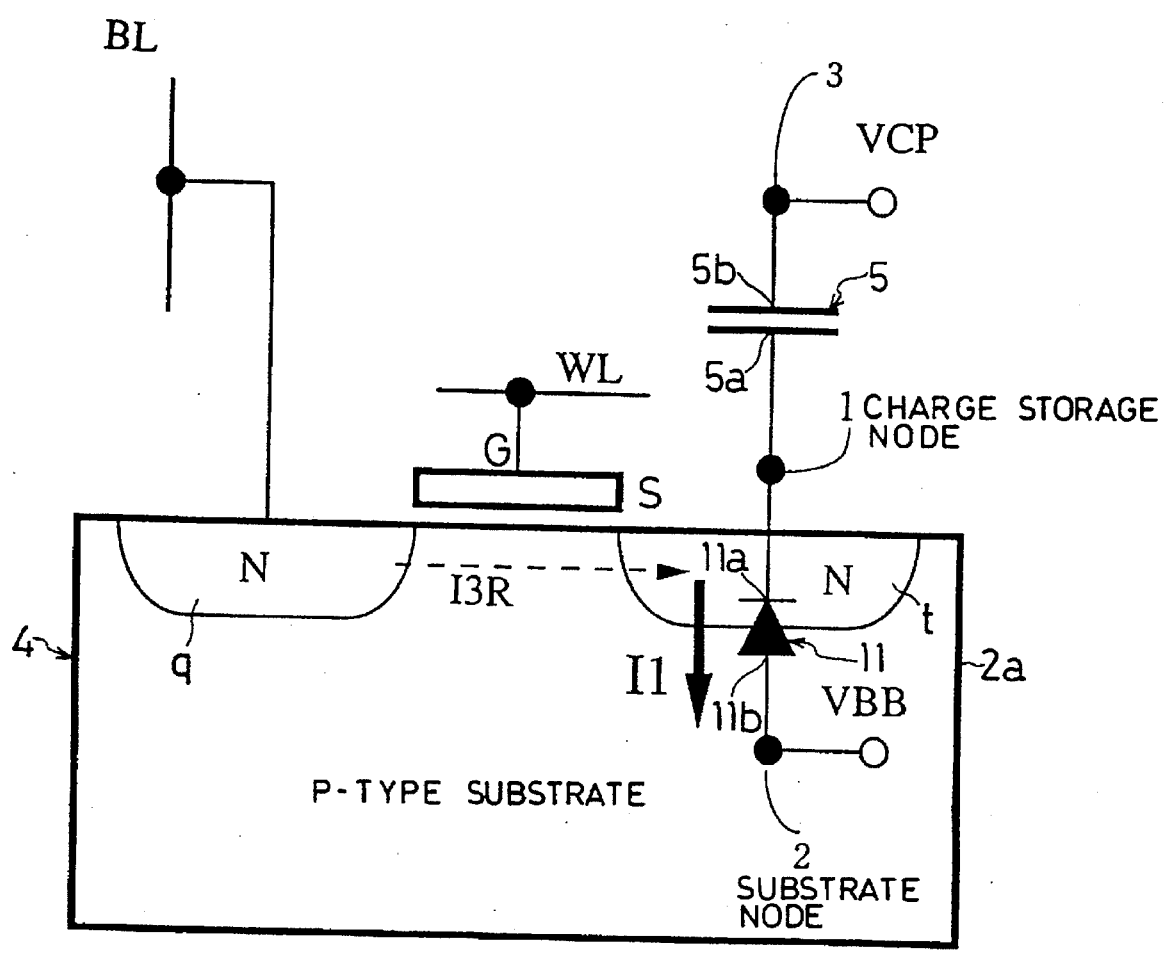
FIG. 2 is a schematic diagram of a memory cell transistor of Embodiment 1.

The configuration of the memory cell transistor 4 is shown in FIG. 2. The memory cell transistor 4 is formed as an N-type transistor including the first N-type electrode (q), the second N-type electrode (t) and a gate electrode G formed on a P-type substrate 2a. In the N-type memory cell transistor 4 of FIG. 2, there exists a PN junction 11 between the second N-type electrode (t) and the P-type substrate 2a. The PN junction 11 is a junction diode, one end of which close to the charge storage node 1 works as a cathode electrode and the other end of which close to the substrate node 2 works as an anode electrode, so as to allow a current to flow from the substrate node 2 to the charge storage node 1. A DRAM configuration obtained by combining the DRAM of FIG. 1 and the PN junction 11 of the memory cell transistor 4 of FIG. 2 is shown in FIG. 3.

The cell plate node potential switching circuit 8 is connected to a high potential generating circuit (a first cell plate potential generating circuit) 16 for generating a predetermined high potential (predetermined potential) Vcp1 (for example, of 1.8 V) and a low potential generating circuit (a second cell plate potential generating circuit) 17 for generating a predetermined low potential Vcp2 (for example, of 0 V). The cell plate node potential switching circuit 8 selects either the high potential Vcp1 (=1.8 V) or the low potential Vcp2 (=0 V), so as to supply the selected potential to the cell plate node 3 via the output terminal 8a.

In the standby state, burst (intensive) refresh is conducted. Therefore, the standby time can be divided into an intensive refresh period when the burst refresh is conducted and a halt period when the burst refresh is not required. In the halt period, the bit lines BL and /BL are both precharged to an intermediate potential (½·Vcc) that is ½ of the supply voltage Vcc. In FIG. 3, a reference numeral 7 denotes a timer circuit for distinguishing the refresh period and the halt period through its time counting operation during the standby time. The timer circuit 7 outputs a period signal corresponding to the refresh period or the halt period to the cell plate node potential switching circuit 8 and also outputs a RAS (row address strobe) signal in the refresh period.

The cell plate node potential switching circuit 8 selects, in response to the period signal from the timer circuit 7, the high potential generating circuit 18 in the refresh period, and selects the low potential generating circuit 17 in the halt period. The cell plate node potential switching circuit 8 supplies the selected potential Vcp1 or Vcp2 to the cell plate node 3 as a cell plate node potential Vcp.

Figure 4:
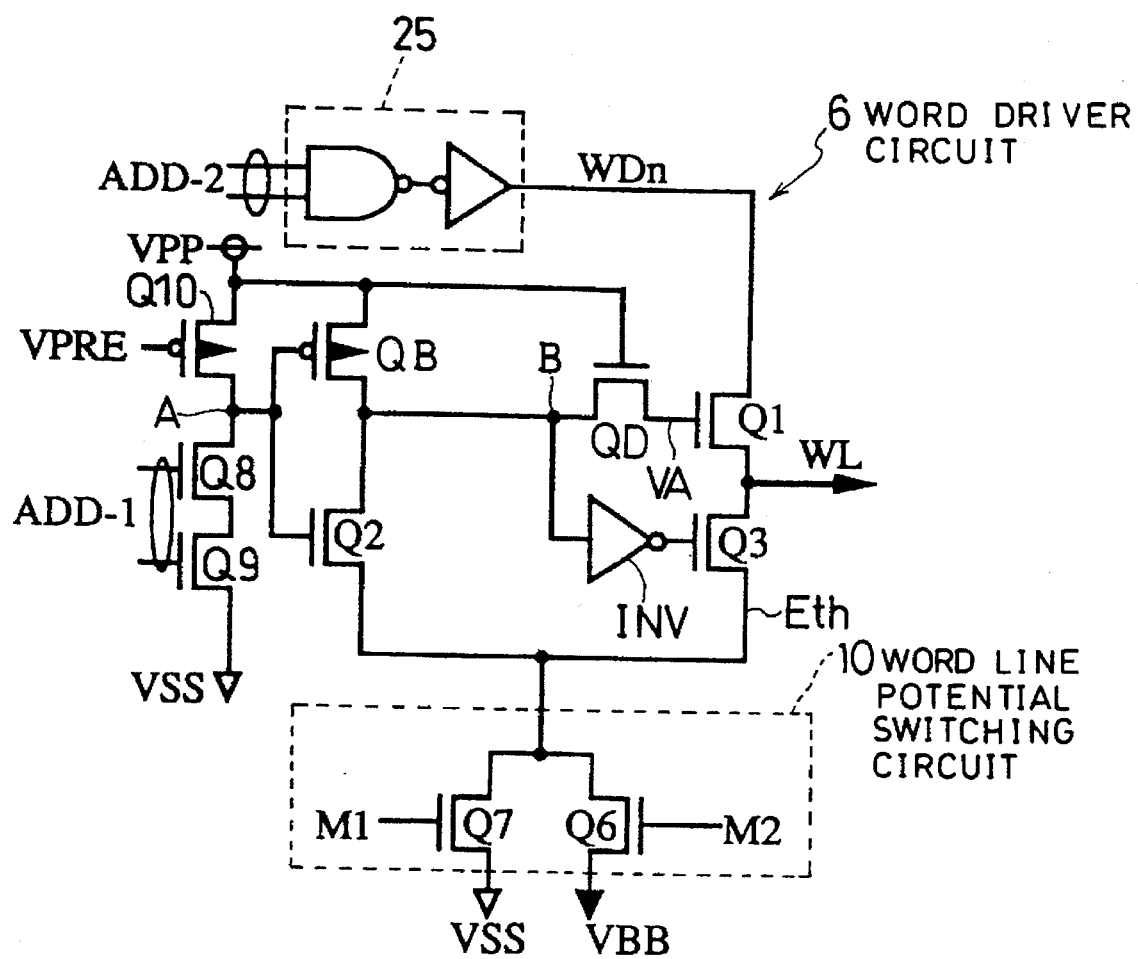
FIG. 4 shows specific configuration of a word driver circuit and a word line potential switching circuit of Embodiment 1.

As is shown in FIG. 3, the word driver circuit 6 is connected to a word line potential switching circuit 10. The word line potential switching circuit 10 selects and outputs either a ground potential Vss (=0 V) or a negative potential VBB (for example, of −1.5 V). Specifically, the word line potential switching circuit 10 includes a grounded first NMOS transistor Q7 and a second NMOS transistor Q6 which is supplied with the negative potential VBB (−1.5 V) as is shown in FIG. 4. The first NMOS transistor Q7 receives at its gate a period signal corresponding to the intensive refresh period (at a high level) from the timer circuit 7 as well as a signal M1 corresponding to an operation period, so as to be turned on. The second NMOS transistor Q6 receives at its gate a period signal corresponding to the halt period (at a high level) from the timer circuit 7, so as to be turned on.

The specific configuration of the word driver circuit 8 is shown in FIG. 4. In FIG. 4, reference characters WD denotes a word drive line, Eth denotes a ground line, Q1 denotes an NMOS drive control transistor for connecting the word drive line WD to the word line WL, and Q3 denotes an NMOS ground control transistor for connecting the ground line Eth to the word line WL. The ground control transistor Q3 is connected to the transistors Q6 and Q7 in the word line potential switching circuit 10.

Furthermore, the word driver circuit 6 includes a decoder 25 for decoding an input signal ADD-2. When the word line WL connected thereto is selected, the word drive line WD is set at a high potential VWL0 (=3.6 V) by the output of the decoder 25. The word driver circuit 6 also includes NMOS transistors Q8 and Q9 connected in series to each other, for receiving a selection signal ADD-1. When the content of the signal specifies the word driver circuit 6 to which these transistor belong, the transistors Q8 and Q9 are turned on, thereby setting the potential of a node A at the ground potential Vss. A transistor Q10 receives an input signal VPRE, and is turned on when the potential of the signal VPRE is at a low level, thereby supplying a potential VPP of a step-up power supply (a potential for activating the word line WL) to the node A. An NMOS transistor Q2 is turned on when the potential of the node A is at a high level (=VPP), thereby supplying a node B with a normal potential VWL1 (=Vss) or a negative potential VWL2 (=VBB=−1.5 V) selected by the word line potential switching circuit 10. A PMOS transistor QB is turned on when the potential of the node A is at a low level (=Vss), thereby supplying the activating potential VPP to the node B. An NMOS transistor (first transistor) QD is turned on when the potential of the node B is the normal potential VWL1 (=Vss) or the negative potential VWL2 (=VBB=−1.5 V), thereby setting the potential of a node VA (the gate of the drive control transistor Q1) at the normal potential VWL1 (=Vss) or the negative potential VWL2 (=VBB=−1.5 V). When the potential of the node B is the activating potential VPP, the NMOS transistor QD sets the potential of the node VA at a predetermined potential (VPP−Vt (wherein Vt is a threshold voltage)). An inverter INV inverts the potential of the node B and supplies the inverted potential to the gate of the ground control transistor Q3.

The word driver circuit 6 having the aforementioned configuration is operated as follows: During the operation and in the burst refresh period in the standby state, when the word line WL belonging thereto is selected, the transistors Q8, Q9, QB and QD are turned on by the signal ADD-1, thereby allowing the node VA to have the predetermined potential (VPP−Vt). As a result, the drive control transistor Q1 is turned on. Also, the signal ADD-2 allows the word drive line WD to have the high potential VWL1 (=3.6 V). Thus, the potential of the word line WL is set at the high potential VWL1 (=3.6 V). At this point, the transistors Q10 and Q2 and the ground control transistor Q3 are in an off state.

When the word line WL belonging thereto is not selected during the operation and in the refresh period in the standby state, the first transistor Q7 is turned on in the word line potential switching circuit 10, thereby supplying the normal potential VWL1 (=Vss) to the ground line Eth of the word driver circuit 6. The transistors Q10 and Q2 are turned on in the word driver circuit 6, thereby setting the potential of the node B at the ground potential VWL1 (=Vss). As a result, the ground control transistor Q3 is turned on, thereby setting the potential of the word line WL at the potential VWL1 (=Vss) of the ground line Eth. At this point, the transistor QB and the drive control transistor Q1 are in an off state.

During the halt period in the standby state, the second transistor Q6 is turned on in the word line potential switching circuit 10, thereby supplying the negative potential VWL2 (=VBB=−1.5 V) to the ground line Eth of the word driver circuit 6. The word driver circuit 6 is operated in the same manner as in the case where the word line WL belonging thereto is not selected. Specifically, the potential of the node B becomes the negative potential VWL2 (=VBB=−1.5 V) as a result of the on operation of the transistors Q10 and Q2, and the ground control transistor Q3 is turned on, thereby setting the potential of the word line WL at the potential VWL2 (=−1.5 V) of the ground line Eth. At this point, since the node B and the node VA are also supplied with the negative potential VBB (=−1.5 V), the drive control transistor Q1 is in an off state.

When the driving ability of the second transistor Q6 is set to be smaller than that of the first transistor Q7, the potentials of the word line WL and the node VA can be lowered through the first transistor Q7 alone to approximately the ground potential Vss even when the transistors Q6 and Q7 are both in an on state. Then, the potentials are gradually lowered to the negative potential VBB (=−1.5 V) through the second transistor Q6. The word driver circuit 6 and the word line potential switching circuit 10 together form an electrode potential switching circuit 20 for switching the potential of the gate of the memory cell transistor 4.

Figure 5:
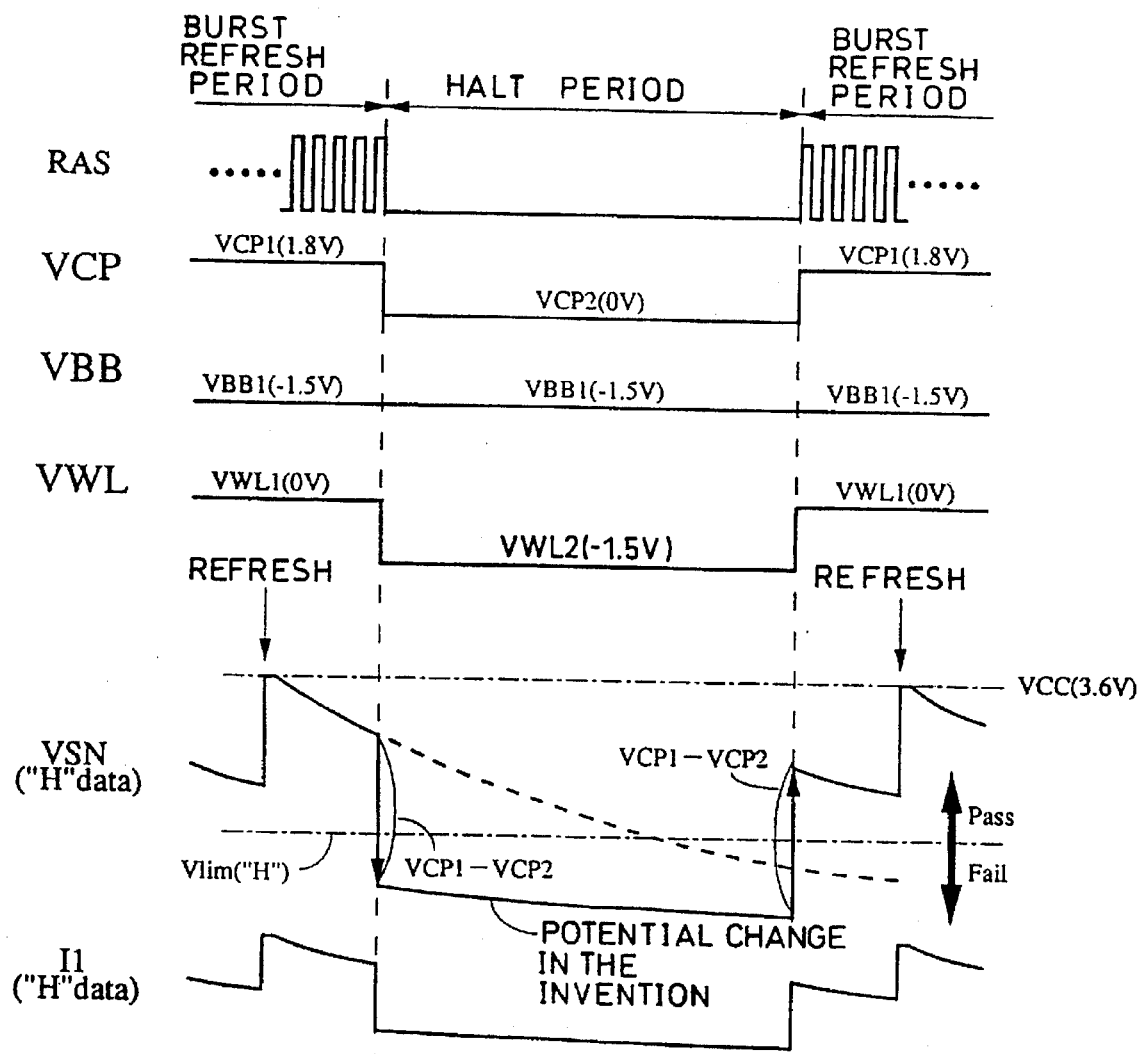
FIG. 5 is a waveform diagram for showing an operation of the DRAM of Embodiment 1.
Figure 6:
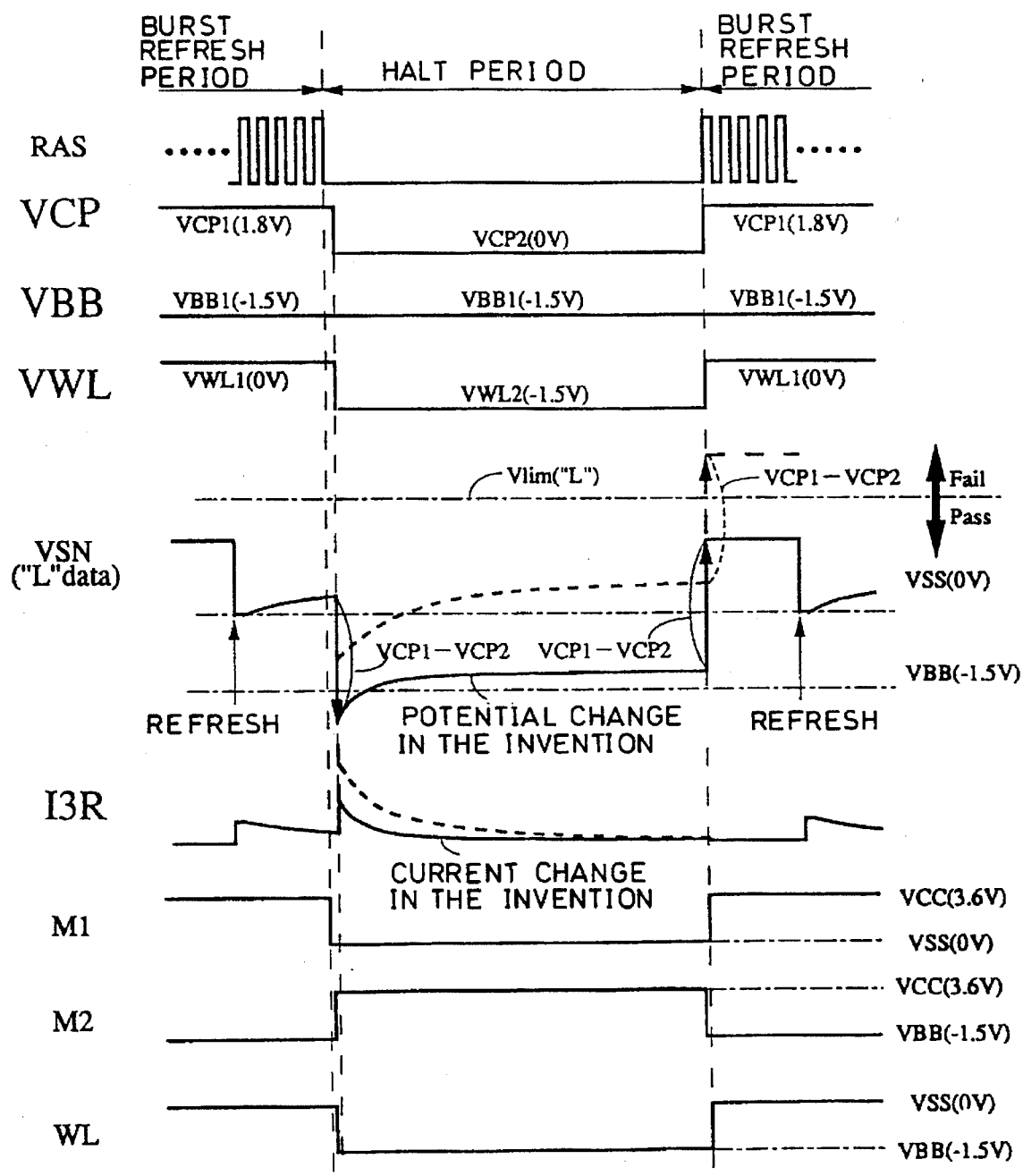
FIG. 6 is a waveform diagram for showing another operation of the DRAM of Embodiment 1.

Now, the operation of the DRAM of this embodiment will be described. During the intensive (burst) refresh period (first period) in the standby state, the word driver circuit 6 repeatedly generates the RAS signal as is shown in FIG. 5. The RAS signal activates and selects the word lines one by one, and the memory cell transistor 4 connected to the selected word line is turned on, thereby conducting the refresh operation of the corresponding memory cell 22. Specifically, this refresh operation is conducted as follows. When the memory cell transistor 4 is turned on, charge stored at the charge storage node 1 is transferred to the bit line BL via the memory cell transistor 4. Then a potential difference between the bit lines BL and /BL ins amplified by the sense amplifier 23. The amplified charge of the bit line BL is re-charged in the charge storage node 1 via the memory cell transistor 4. During the refresh period, the unselected word lines WL are supplied with the predetermined potential VWL1 (=0 V) by the word driver circuit 6. Additionally, the high potential Vcp1 is applied to the cell plate node 3 by the potential switching circuit 8 and the predetermined potential VBB1 (=−1.5 V) is applied to the substrate node 2.

When the intensive refresh period elapsed and the halt period (second period) starts, the potential switching circuit 8 switches the cell plate potential Vcp to be applied to the cell plate node 3 from the high potential Vcp1 (=1.8 V) to the low potential Vcp2 (=0 V). At this point, the memory cell transistor 4 is in an off state because the potential VWL of the word line WL is set at the inactivated potential VWL1

(=0 V), and the potential storage node 1 is in a floating state. Also, the stray capacitance of the potential storage node 1 is sufficiently smaller than the capacity of the memory cell capacitor 5. Therefore, when the potential Vcp of the cell plate node 3 decreases by a predetermined potential (Vcp1−Vcp2=1.8 V), the potential VSN of the potential storage node 1 also decreases by approximately 1.8 V due to the capacity coupling of the memory cell capacitor 5.

At this point, when the memory cell 22 stores a high data, a potential difference between the charge storage node 1 and the substrate node 2, that is, a voltage (VSN−VBB) to be applied to the junction diode 11, is decreased from 1.5 V (=3.6 V−(−1.5 V)) to 3.3 V (=1.8 V−(−1.5 V)). When the memory cell 22 stores a low data, the voltage (VSN−VBB) to be applied to the PN junction 11 is decreased from 1.5 V (=0 V−(−1.5 V)) to −0.3 V (=−1.8 V−(−1.5 V)). The amount of the potential decrease in these cases is substantially equal to the decrease amount of the potential Vcp of the cell plate node 3 (i.e., Vcp1−Vcp2=1.8 V). Therefore, in the halt period, the potential difference in the PN junction 11 can be suppressed in the memory cell 22 storing a low or high data, and hence, the amount of a current I1 that leaks from the charge storage node 1 through the junction diode 11 to the substrate node 2 as is shown in FIG. 2 can be decreased.

In the memory cell 22 storing a low data, the potential VSN of the charge storage node 1 is decreased to −0.3 V in accordance with the decrease of the potential Vcp of the cell plate node 3 as described above. Since the PN junction receives forward bias at this point, the potential VSN of the charge storage node 1 is initially clamped around the potential VBB (−1.5 V) of the substrate node 2. At this point, the potential of the first electrode (q) of the memory cell transistor 4 is set at the precharge potential (=½·Vcc) of the bit lint BL, and the second electrode (t) of the memory cell transistor 4 serves as a source. However, since the potential VWL of the word line WL is controlled to decrease from the normal potential VWL1 (=0 V) to the negative potential VBB (=−1.5 V) and the negative potential VBB (=−1.5 V) is applied to the gate of the memory cell transistor 4, gate-source potential Vgs of the memory cell transistor 4 becomes 0. Thus, the off state of the memory cell transistor 4 is enhanced. As a result, the amount of a current flowing from the bit line BL through the memory cell transistor 4 to the charge storage node 1 can be decreased. In this manner, the low data stored in the charge storage node 1 can be successfully retained.

Then, when the subsequent refresh period starts, the potential Vcp of the cell plate node 3 is switched from the low potential Vcp2 (=0 V) to the high potential Vcp1 (=1.8 V). As a result, the potential VSN of the charge storage node 1 is increased by approximately 1.8 V by the capacity coupling of the memory cell capacitor 5. The amount of the potential change (Vcp1−Vcp2) of the cell plate node 3 is optionally set so that the increased potential VSN of the charge storage node 1 is set to be higher than a high data read limit voltage Vlim ("H") (=the initial potential Vcc—a potential decrease amount ΔVH in the halt period) in storing a high data, and is set to be lower than a low data read limit voltage Vlim ("L") (=the initial potential Vss (=0 V)+a potential increase amount ΔVL in the halt period) in storing a low data. Thus, the low or high data stored in the charge storage node 1 can be read out.

Therefore, as is shown with a solid line in FIG. 5, no matter whether the charge storage node 1 stores a low data or a high data, a rate of the potential change in the charge storage node 1 becomes smaller than that in the conventional device shown with a broken line in FIG. 5. This results in longer data retention time.

Figure 28:
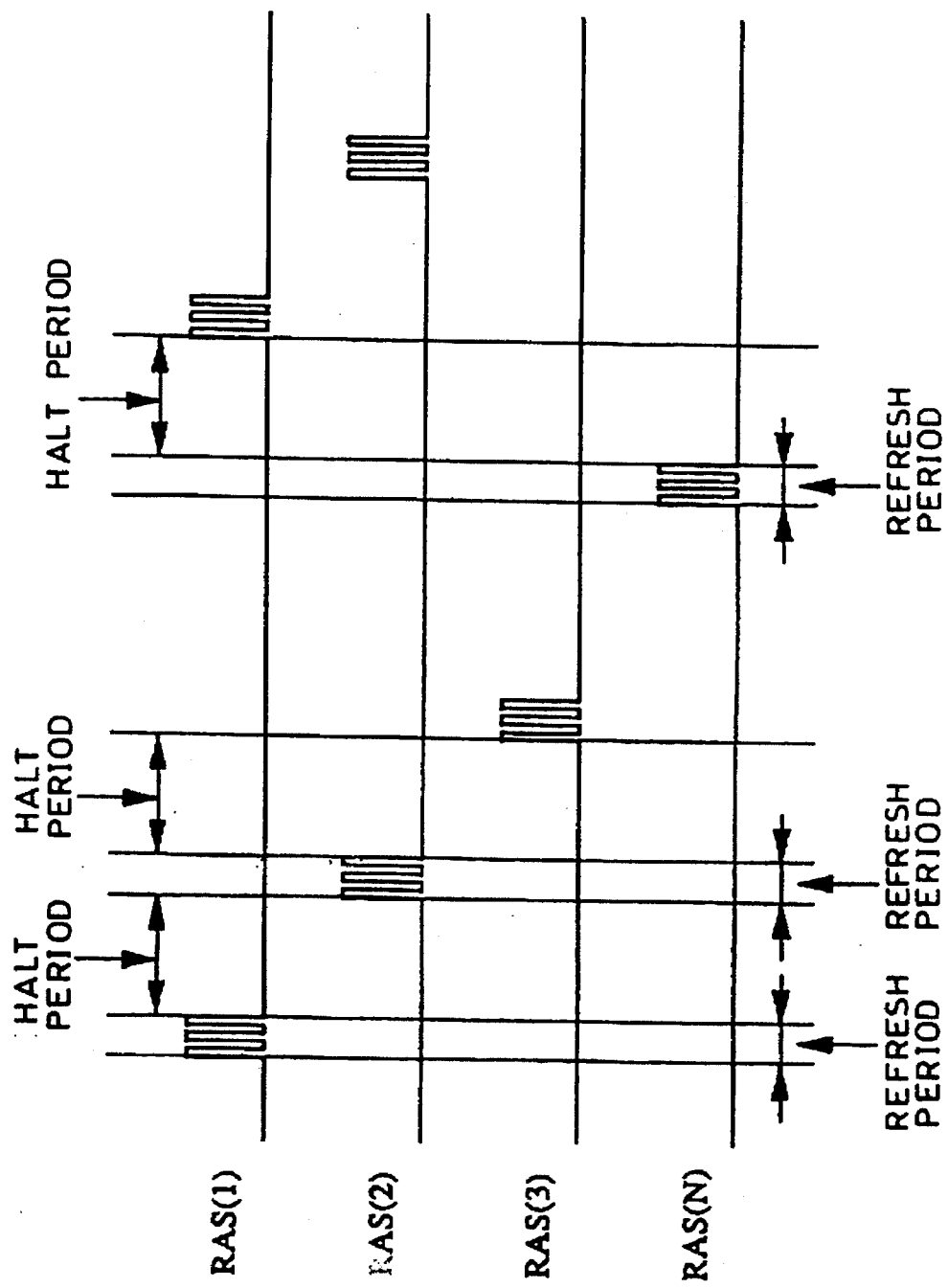
FIG. 28 is a time chart adopted in conducting distributed refresh in the present invention.

The potential Vcp of the cell plate node 3 is described to be switched from the high potential Vcp1 (=1.8 V) to the low potential Vcp2 (=0 V) in the halt period in the standby state in this embodiment, which does not limit the invention. The invention can be applied to, for example, distributed refresh shown in FIG. 28, in which a cell plate is electrically distributed to each of the plural word lines WL and the potential of a cell plate node 3 to which the selected word line belongs is switched from the low potential Vcp2 (=0 V) to the high potential Vcp1 (=1.8 V). The distributed refresh emits a smaller amount of heat than the intensive refresh since a burst refresh period is divided into a plurality of parts.

(Modification 1 of Embodiment 1)

Figure 7:
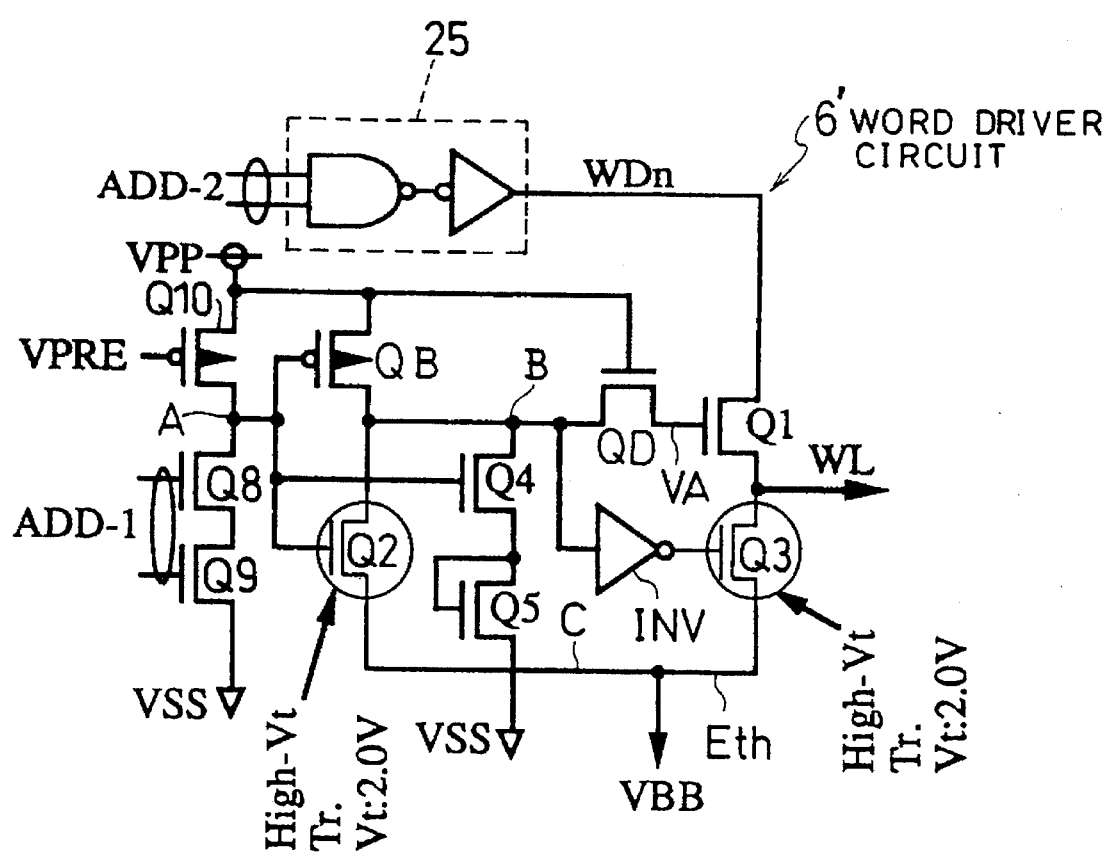
FIG. 7 is a circuit diagram of a word driver circuit used in first modification of Embodiment 1.
Figure 8:
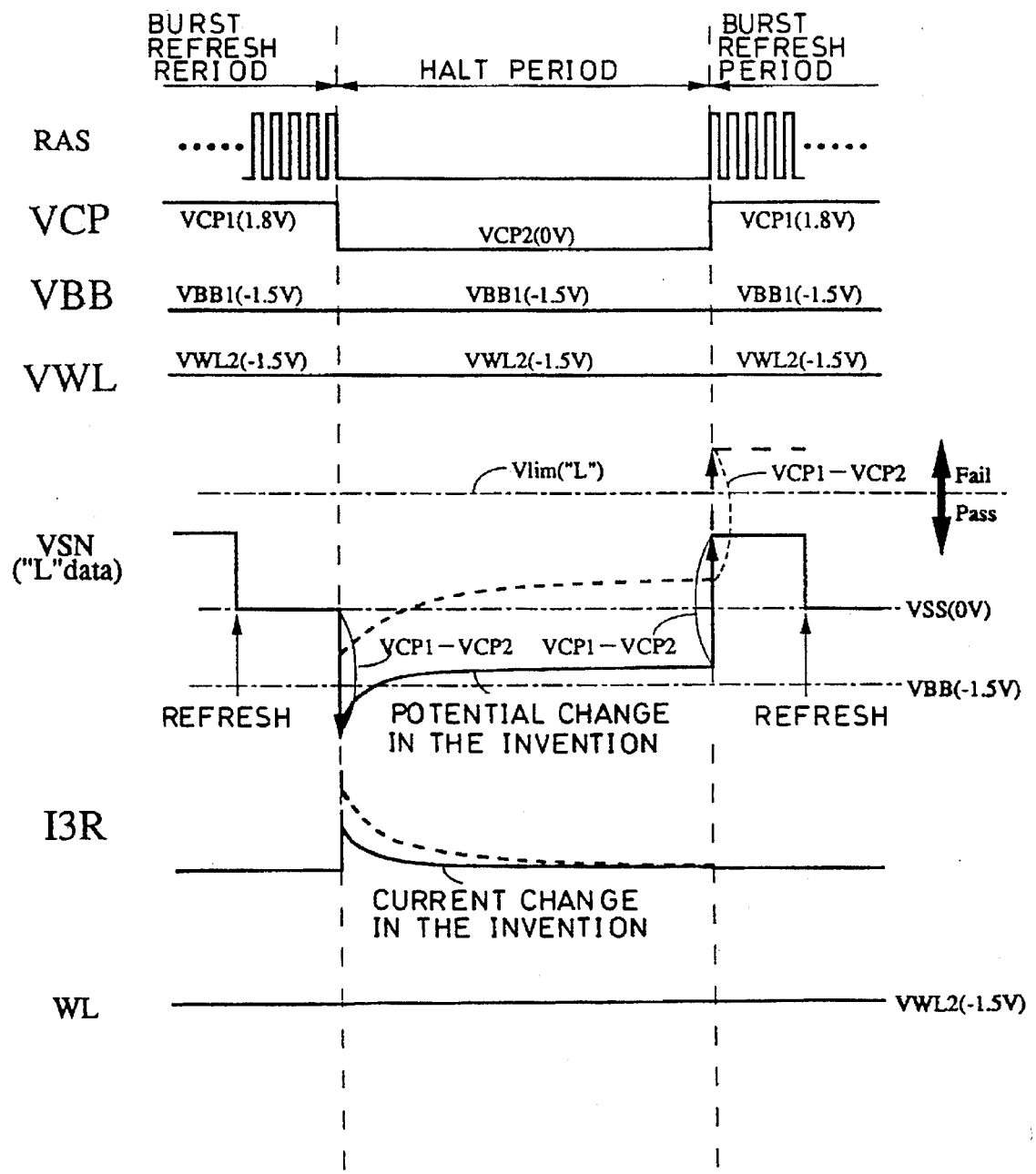
FIG. 8 is a waveform diagram for showing an operation of the DRAM of the first modification of Embodiment 1.
Figure 9:
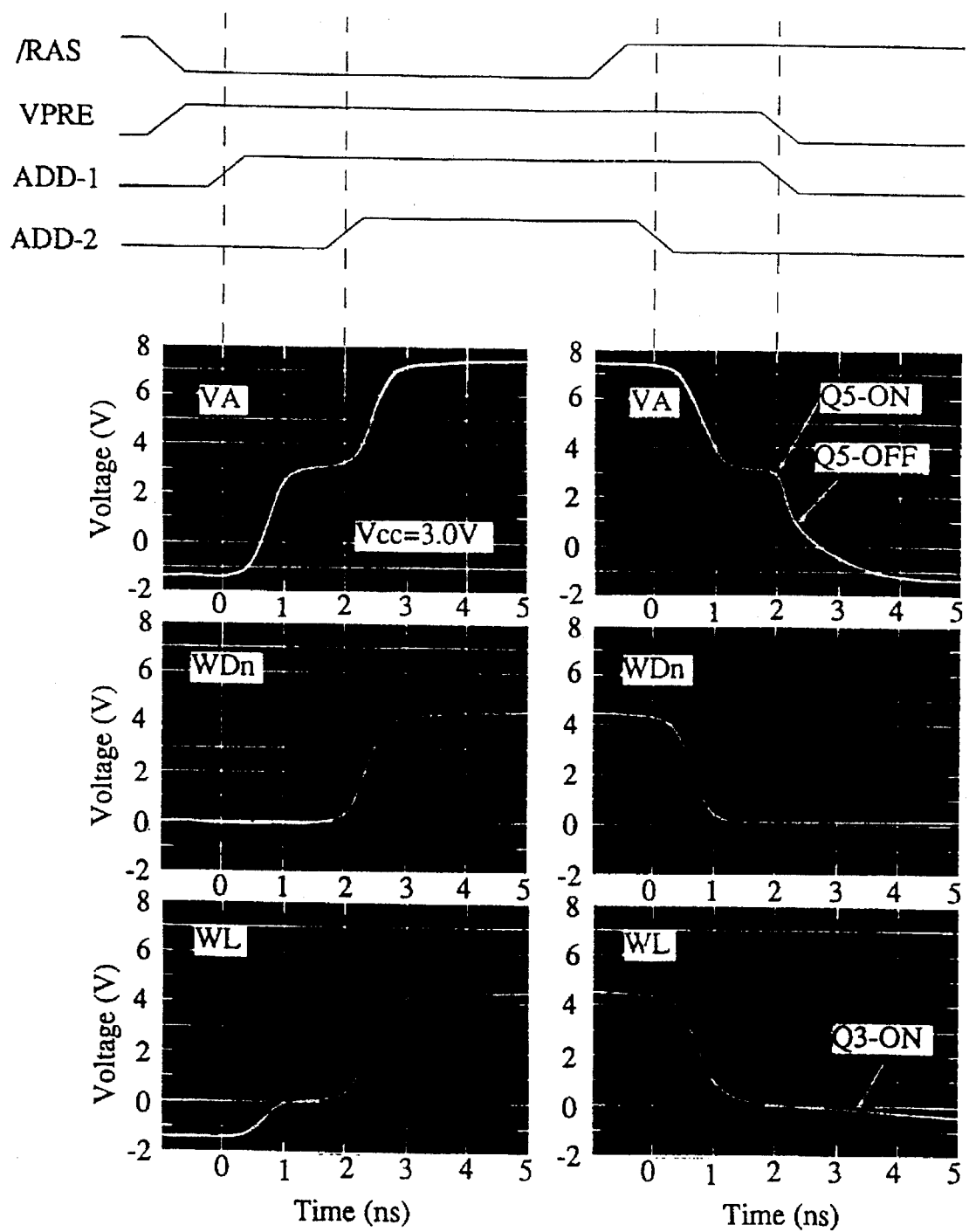
FIG. 9 shows a simulation waveform of the word driver circuit of the first modification of Embodiment 1.

FIGS. 7 through 9 show Modification 1 of Embodiment 1. In Embodiment 1, the potential of the word line WL is set at the ground potential Vss in the intensive refresh period and at the negative potential VBB in the halt period. In this modification, the potential of the word line WL is set at the negative potential VBB both in the refresh period and the halt period, by partly changing the configuration of the word driver circuit 6, as is shown in FIG. 7. Thus, the off state of the memory cell transistor 4 is always enhanced in the standby state.

Specifically, in a word driver circuit 6' shown in FIG. 7, a ground control transistor (a negative potential control transistor) Q3 and an NMOS transistor (a second transistor) Q2 are both formed out of a transistor having a large threshold voltage VtN. The threshold voltage VtN is larger than a voltage difference (=1.5 V) between the ground voltage Vss and the negative potential VBB (=−1.5 V) (Vss−VBB≦VtN) (for example, VtN=2.0 V). A node C connecting these transistors Q2 and Q3, that is, a ground line (wire) Eth, is connected to the negative potential VBB. Between a node B and the ground are disposed two NMOS transistors Q4 and Q5 connected in series to each other. The gate of one transistor (third transistor) Q4 is supplied with the potential of a node A, and the other transistor Q5 is diode connected. The driving ability of these transistors Q4 and Q5 is set to be larger than that of the NMOS transistor Q2.

The word driver circuit 6' is operated as follows: In the following description, merely a difference from the operation of the word driver circuit 6 of Embodiment 1 will be described. During the operation and the refresh period, when the word line belonging thereto is selected, the potential of the node A becomes the ground potential Vss and the potential of the node B becomes the activating potential VPP. Therefore, the drive control transistor Q1 is turned on, thereby setting the potential of the word line WL at the potential VPP of the word drive line WD. At this point, the gate-source voltage Vgs of the NMOS transistor Q2 becomes 1.5 V (Vgs=Vss−VBB=1.5 V). However, the threshold voltage VtN (=2.0 V) is larger than the voltage Vgs (=1.5 V), and hence, the NMOS transistor Q2 is in an off state. Thus, a through current from the node B to the negative potential VBB is prevented from occurring. Furthermore, the potential VPP of the node B is inverted by the inverter INV to give the ground potential Vss, which is input to the gate of the ground control transistor Q3. Therefore, the gate-source potential Vgs of the ground control transistor Q3 becomes a potential (Vss−VBB). However, since the ground control transistor Q3 is in an off state for the same reason as described above, no through current from the word line WL to the negative potential VBB occurs.

When the word line belonging thereto is not selected in the refresh period, and during the halt period, the potential of the node A becomes the activating potential VPP at the initial state, and hence, the NMOS transistors Q2, Q4 and Q5 are simultaneously turned on. However, since the driving ability of the transistor Q2 is smaller than those of the other transistors Q4 and Q5 connected in series, charge stored in the node B and the node VA is discharged to the ground through the transistors Q4 and Q5 connected in series. When the node B and VA attains a predetermined potential (=Vss+ Vt), the charge in these nodes is discharged to the negative potential VBB through the transistor Q2, and the potentials of the nodes B and VA become the negative potential VBB. As a result, the ground control transistor Q3 is supplied with a supply potential (at a high level) at its gate so as to be turned on, thereby connecting the word line WL to the negative potential VBB via the ground line Eth. Thus, the potential of the word line WL becomes the negative potential VBB. A simulation waveform of the operation of the word driver circuit 6' is shown in FIG. 9 as reference data.

Accordingly, in this modification, there is no need to supply a control signal to the word line potential switching circuit 10 of Embodiment 1, and the configuration can be advantageously simplified without increasing current consumption.

(Modification 2 of Embodiment 1)

Figure 10A:
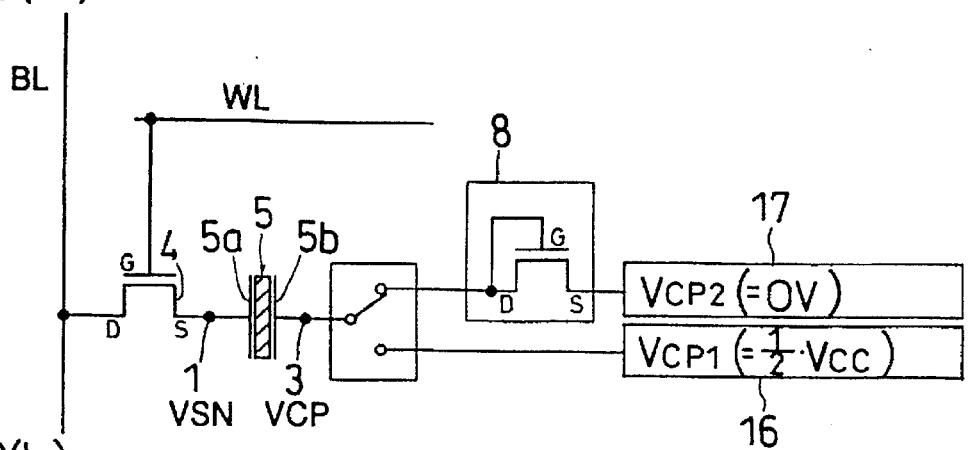
FIG. 10(a) is a circuit diagram of an equivalent circuit in the main part of a DRAM of second modification of Embodiment 1.

FIG. 10(a) shows Modification 2 of Embodiment 1. In Embodiment 1, even though the off current through the memory cell transistor 4 is suppressed, the following problem arises when the change amount of the potential Vcp of the cell plate node 3 (i.e., Vcp1–Vcp2) is large: When the potential of the cell plate node 3 is switched from the low potential Vcp1 to the normal potential Vcp2, a low data cannot be read out because the potential of the charge storage node 1 exceeds the low data read limit voltage Vlim ("L"). Therefore, in this modification, the amount of the potential change in the cell plate node 3 is made decreased.

Specifically, as is shown in FIG. 10(a), an NMOS diode 12 is interposed between the cell plate node potential switching circuit 8 and the low potential generating circuit 17. The diode 12 comprises an NMOS transistor, whose source S is connected to the low potential generating circuit 17 and whose gate G and drain D are connected to the potential switching circuit 8.

Figure 11:
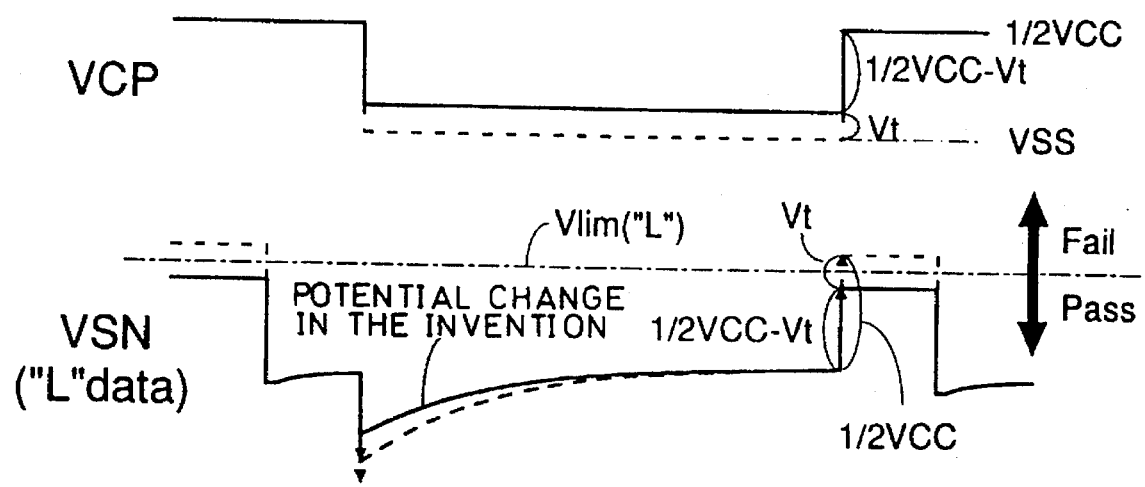
FIG. 11 is a waveform diagram for showing an operation of the DRAM of the second modification of Embodiment 1.

Therefore, in this modification, when the cell plate node potential switching circuit 8 selects the low potential generating circuit 17, the potential Vcp of the cell plate node 3 becomes a voltage (Vcp1–Vt), which is higher than the low potential Vcp1 (=0 V) by the threshold voltage Vt of the NMOS transistor, as is shown in FIG. 11. As a result, the amount of the potential change in the cell plate node 3 is ½·Vcc–Vt, which is smaller than that in the case where the NMOS diode 12 is omitted (i.e., Embodiment 1) by the threshold voltage Vt. Accordingly, when the potential Vcp of the cell plate node 3 is increased from the low potential Vcp2 (=0 V) to the high potential Vcp1 (=½·Vcc), the potential VSN of the charge storage node 1 can be suppressed to be smaller than the low data read limit voltage Vlim ("L") as is shown with a solid line in FIG. 11 even in the case where the potential VSN of the charge storage node 1 of Embodiment 1 slightly exceeds the low data read limit voltage Vlim ("L") as is shown with a broken line in FIG. 11. Thus, a low data can be read out without fail.

In addition, a precharge power supply for the bit line BL can be used as the high potential Vcp1 (=½·Vcc) of the high potential generating circuit 16 and a ground potential GND of the entire chip mounting the DRAM can be used as the low potential Vcp2 (=0 V). Therefore, there is no need to separately provide a potential generating circuit.

Furthermore, when the diode 12 is formed out of a transistor having a threshold voltage Vt with a very small absolute value, the amount of the potential change in the cell plate node 3 can be more finely adjusted.

Figure 10B:
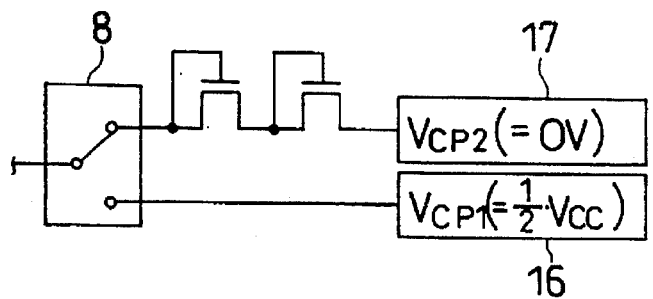
FIG. 10(b) shows an example of a diode included in the DRAM of the second modification of Embodiment 1.
Figure 10C:
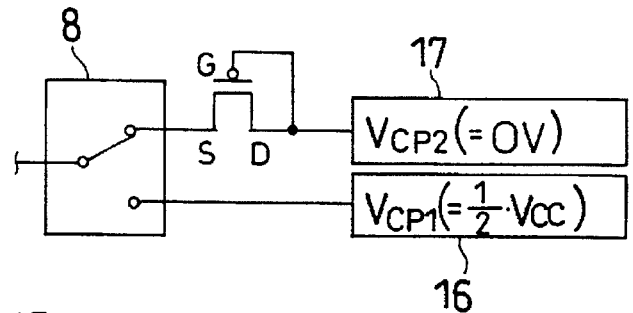
FIG. 10(c) shows another example of the diode.
Figure 10D:
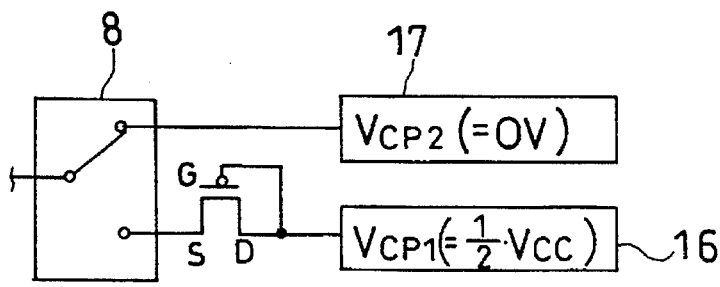
FIG. 10(d) shows still another example of the diode.
Figure 10E:
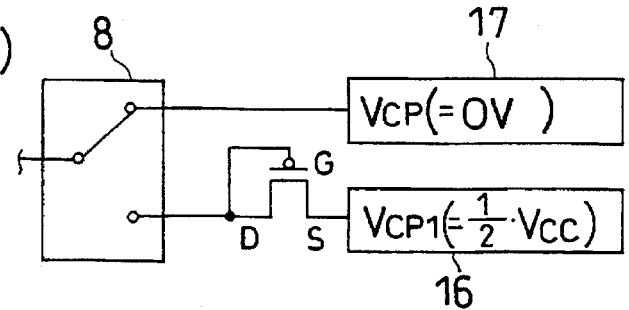
FIG. 10(e) shows still another example of the diode.

The diode 12 can be also formed out of two or more NMOS transistors connected in series to each other as is shown in FIG. 10(b). Alternatively, the NMOS transistor can be replaced with a PMOS transistor as is shown in FIG. 10(c). In this case, the source of the PMOS transistor is connected to the potential switching circuit 8, and the gate and the drain thereof are connected to the low potential generating circuit 17. Alternatively, the diode can be interposed between the potential switching circuit 8 and the high potential generating circuit 16. In this case, when the diode comprises an NMOS transistor, the gate and the drain thereof are connected to the high potential generating circuit 16 and the source thereof is connected to the potential switching circuit 8 as is shown in FIG. 10(d). When the diode comprises a PMOS transistor, the source thereof is connected to the high potential generating circuit 16 and the gate and the drain thereof are connected to the potential switching circuit 8 as is shown in FIG. 10(e).

(Embodiment 2)

Figure 12:
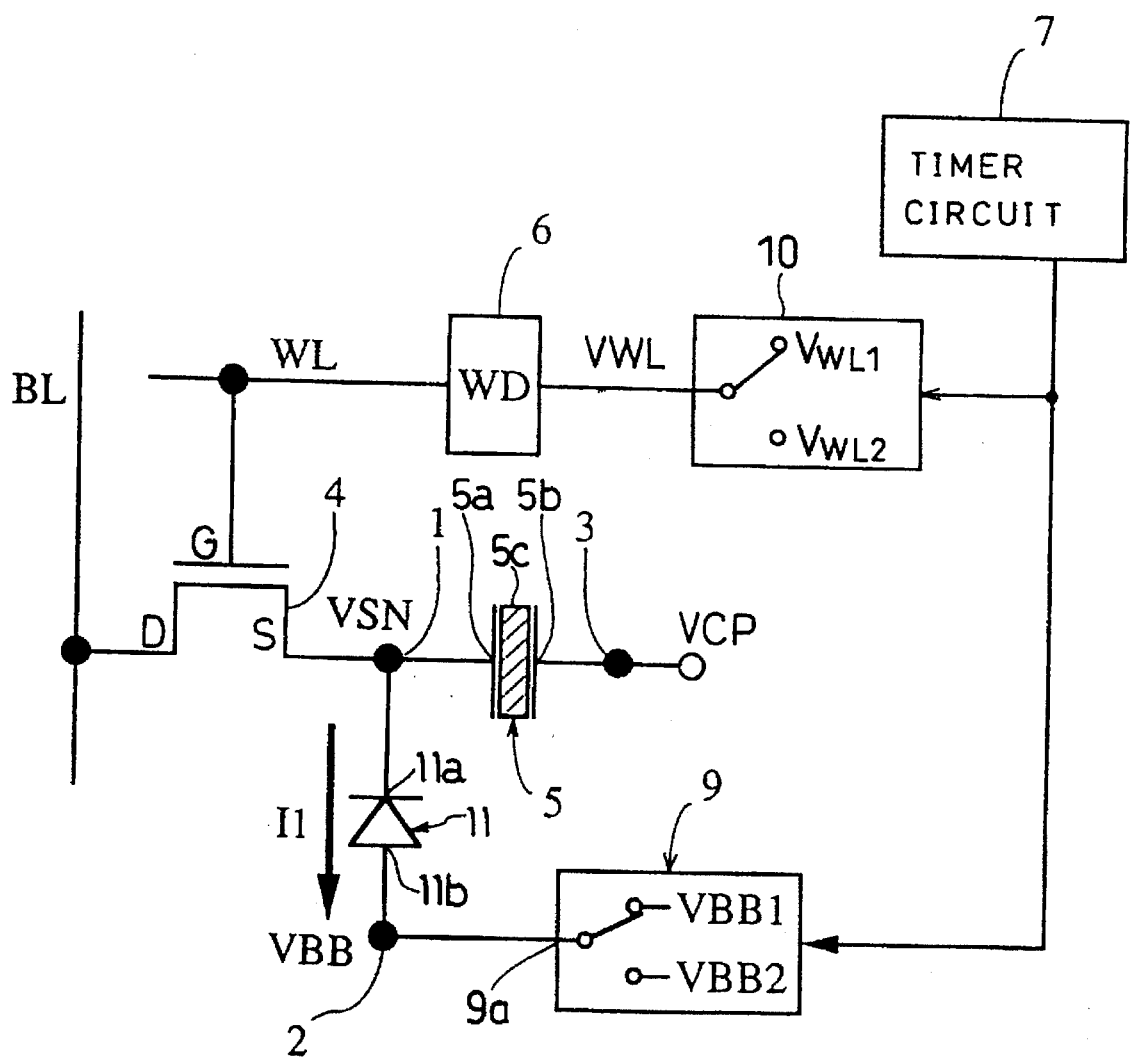
FIG. 12 is a circuit diagram of an equivalent circuit in the main part of a DRAM of Embodiment 2 of the invention.

FIG. 12 shows Embodiment 2 of the invention. In Embodiment 1, the potential Vcp of the cell plate node 3 is switched from the high potential Vcp1 (=1.8 V) to the low potential Vcp2 (=0 V) in the halt period. In contrast in this embodiment, the potential VBB of the substrate node 2 is switched from a low potential VBB1 (=1.5 V) to a high potential VBB2 (=0 V) in the halt period, thereby suppressing the potential difference between the both ends of the PN junction 11.

Specifically, the potential Vcp of the cell plate node 3 is fixed at, for example, a normal value (=1.8 V) in FIG. 12. The substrate node 2 is connected to a substrate node potential switching circuit (substrate potential switching circuit) 9. The substrate node potential switching circuit 9 selects the negative potential (predetermined potential) VBB1 (=–1.5 V) in the refresh period and selects the high potential VBB2 (=0 V) in the halt period, in response to a period signal from the timer circuit 7. The substrate node potential switching circuit 9 supplies the selected potential VBB1 or VBB2 as the substrate node potential VBB via an output terminal 9a thereof to the substrate node 2. The configuration of the DRAM of this embodiment is substantially the same as that of Embodiment 1 except for the above, and hence, like reference numerals are used to refer to like elements used in Embodiment 1 and the description is omitted.

Figure 13:
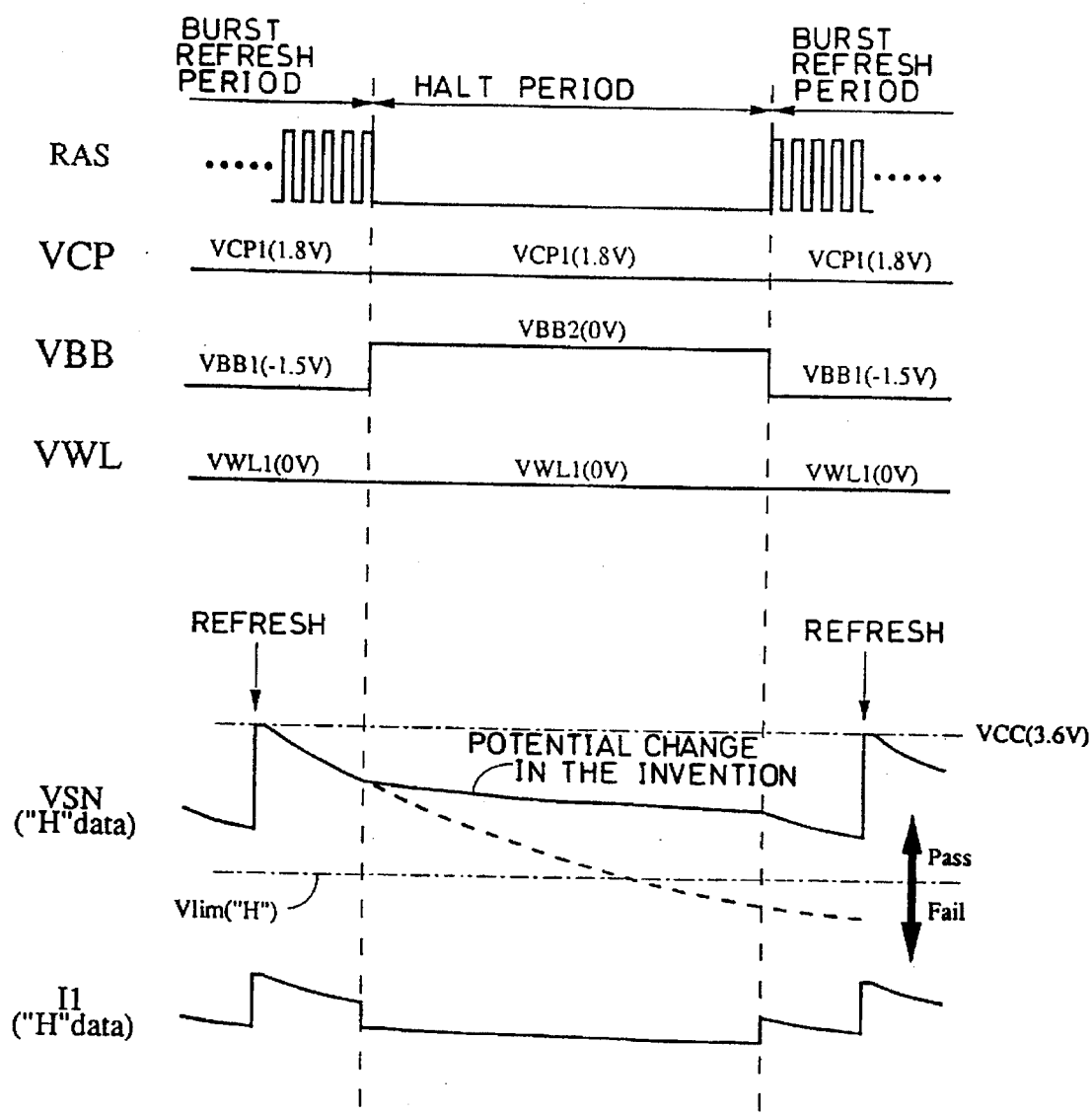
FIG. 13 is a waveform diagram for showing the operation of the DRAM of Embodiment 2.

Accordingly, in this embodiment, the potential VBB of the substrate node 2 is increased from the low potential VBB1 (=–1.5 V) to the high potential VBB2 (=0 V) in the halt period as is shown in FIG. 13. As a result, a potential difference between the charge storage node 1 and the substrate node 2 (i.e., VSN–VBB), that is, the potential difference at the PN junction 11, can be suppressed smaller by the increase amount of the potential in the substrate node 2 (=1.5 V). This results in decreasing the amount of the leakage current I1 flowing from the charge storage node 1 through the PN junction 11 to the substrate node 2 as in Embodiment 1. Therefore, the rate of the change of the potential VSN in the charge storage node 1 becomes smaller, thereby extending the data retention time. This enables to elongate the refresh interval as compared with a conventional interval. Accordingly, current consumption of the internal battery in the standby state can be suppressed, thereby minimizing the power consumption.

It is noted that the potential VBB of the substrate node 2 is switched from the high potential VBB2 (=0 V) to the normal low potential VBB1 (=−1.5 V) in the subsequent refresh period, so as not to affect the subsequent operation of the DRAM.

Figure 14:
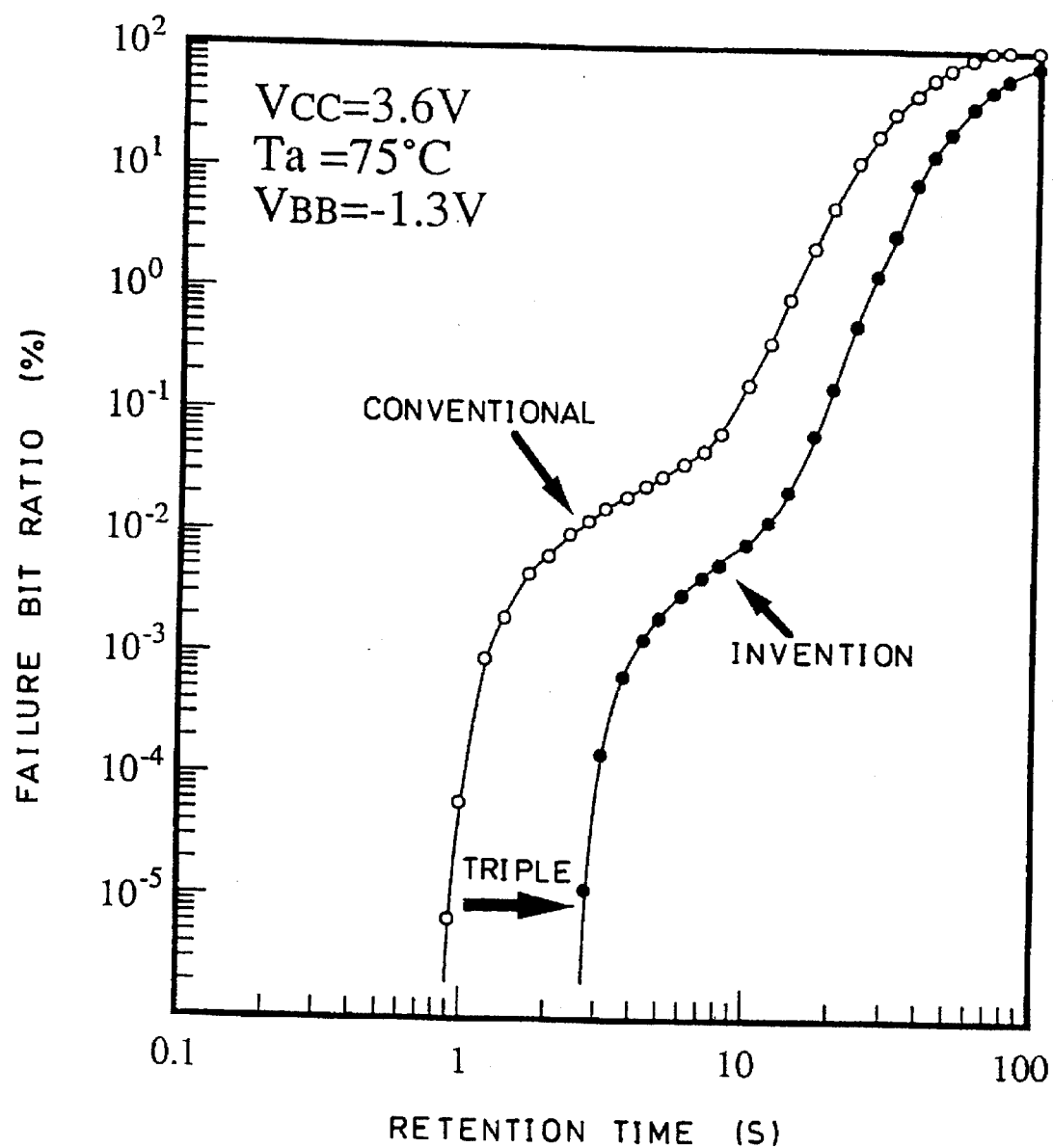
FIG. 14 shows an effect to increase the data retention time of the DRAM of Embodiment 2.

The effect of this embodiment is shown in FIG. 14. As is understood from this figure, the data retention time of this embodiment is approximately three times as long as that of a conventional device.

A refresh current $I_{REF}$ generally depends upon a refresh interval $t_{REF}$, and the relationship is represented as follows:

$$I_{REF} = I_{dc} + Q/t_{REF}$$

In this relational expression, $I_{dc}$ indicates a stationary leakage current. The leakage current $I_{dc}$ can be ignored because it is very small as compared with the entire refresh current. Also in the expression, Q indicates the amount of charge consumed in one refresh operation and is constant. Therefore, when the data retention time is extended by approximately three times as described above, the refresh interval $t_{REF}$ can be extended also by approximately three times. As a result, the amount of the refresh current $I_{REF}$ can be decreased to approximately ⅓ of the conventional amount.

(Embodiment 3)

Figure 15:
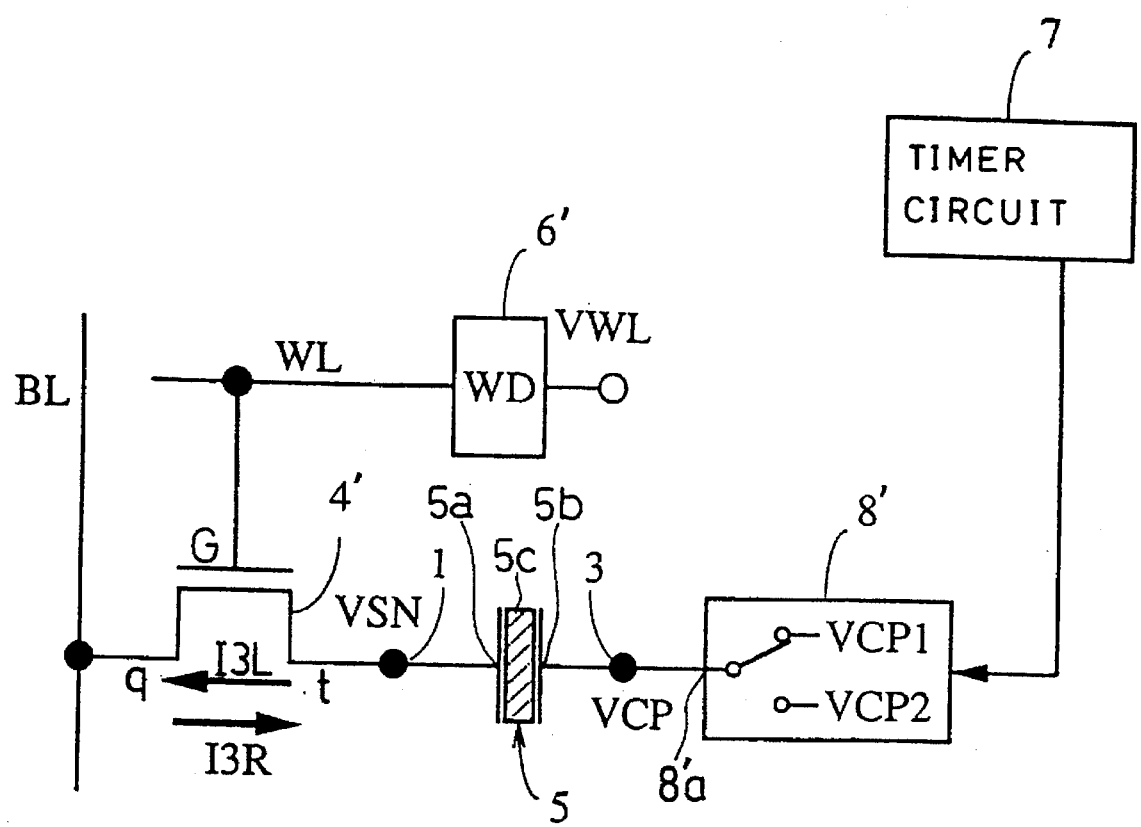
FIG. 15 is a circuit diagram of an equivalent circuit of the main part of a DRAM of Embodiment 3.

FIG. 15 shows Embodiment 3 of the invention. In this embodiment, a current (off current) flowing between first and second electrodes of a memory cell transistor in an off state is suppressed in such a case where a small or no leakage current flows through a PN junction of the memory cell transistor as the application of a transistor with the SOI structure as the memory cell transistor.

Figure 16:
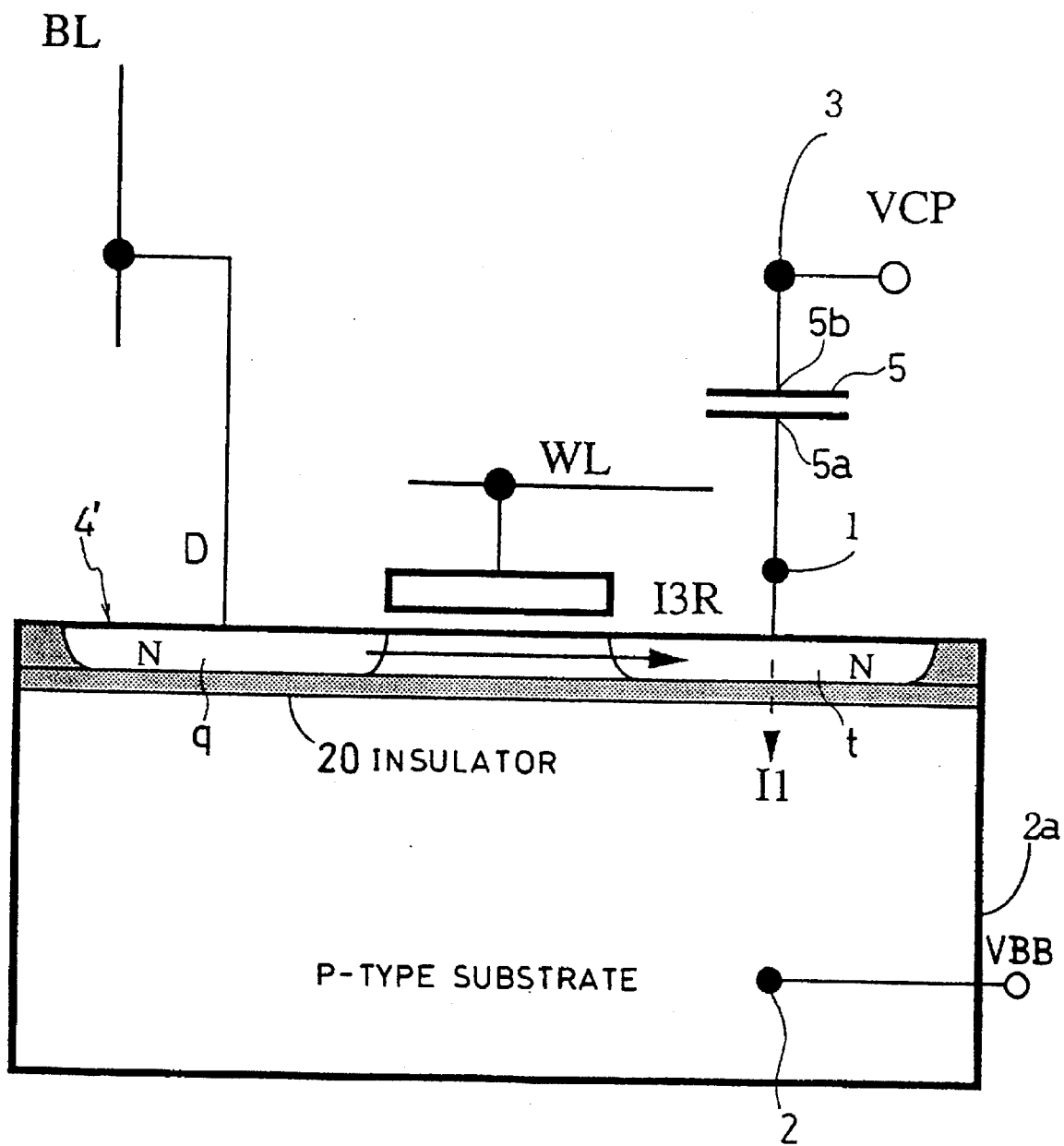
FIG. 16 is a sectional view of a memory cell transistor having the SOI structure used in Embodiment 3.

A memory cell transistor 4' of FIG. 15 is formed as a transistor having the SOI structure. The memory cell transistor 4' includes a P-type substrate 2a and N-type first and second electrodes (q) and (t) with an insulator 20 sandwiched therebetween, as is shown in FIG. 16. Therefore, the SOI structure includes no PN junction between the N-type second electrode (t) connected to a charge storage node 1 and the P-type substrate 2a, and hence, there is no need to pay attention to a leakage current flowing from the charge storage node 1 to the substrate 2a.

In FIG. 15, a reference numeral 8' denotes a cell plate node potential switching circuit (cell plate potential switching circuit). The potential switching circuit 8' receives a period signal from a timer circuit 7 at the standby time, selects a low potential (predetermined potential) Vcp1 (for example, of 1.8 V) in the refresh period and a high potential Vcp2 (for example, of 3.6 V) in the halt period, and supplies a cell plate node 3 with the selected potential Vcp1 or Vcp2 as a cell plate node potential via an output terminal 8'a.

A word driver circuit 6' receives a predetermined potential (=0 V) as a potential VWL to be supplied to an unselected word line WL. The configuration of this embodiment is substantially the same as that of Embodiment 1 except for the above, and hence, like reference numerals are used to refer to like elements used in Embodiment 1 and the description is omitted.

Figure 17:
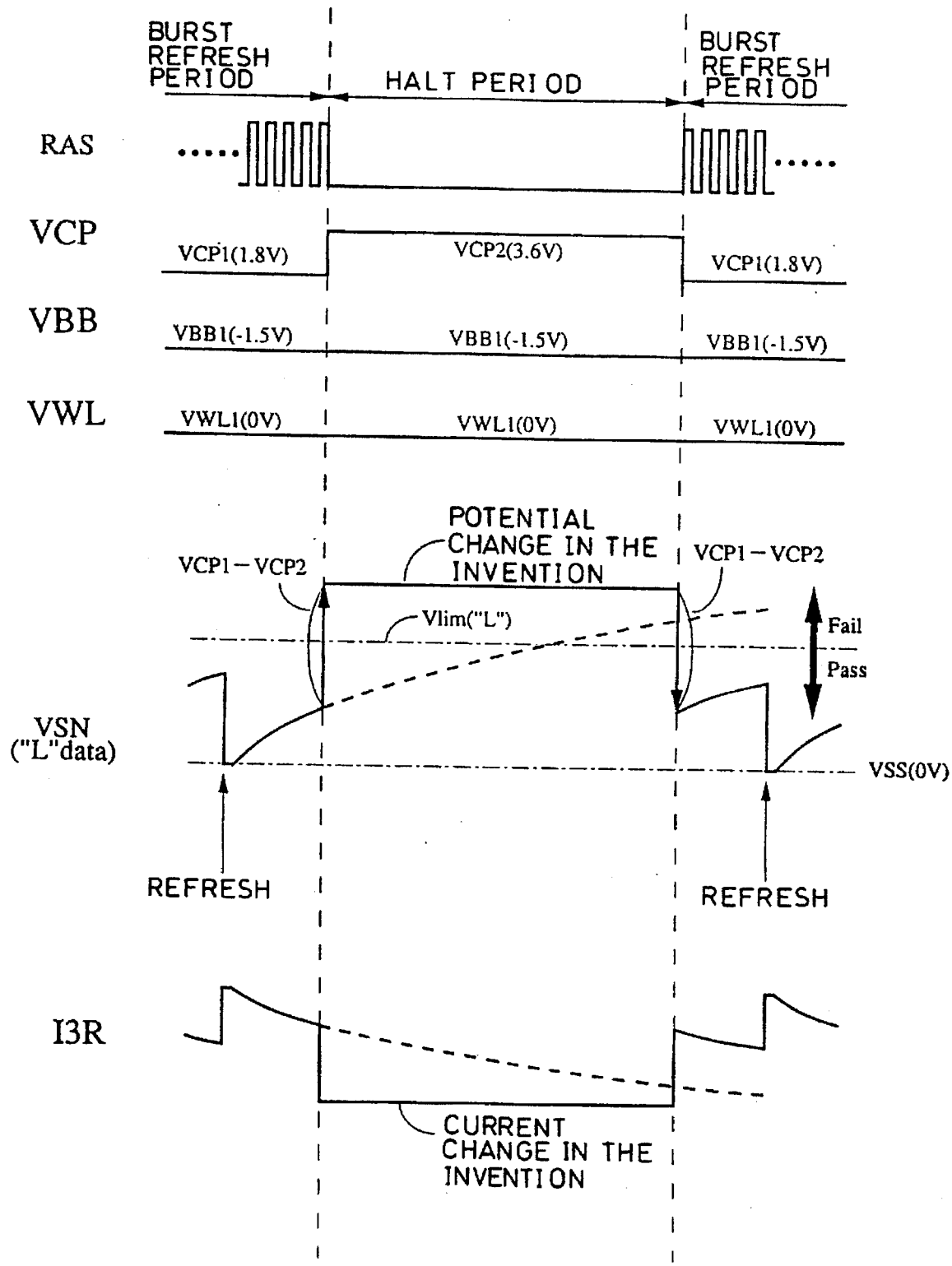
FIG. 17 is a waveform diagram for showing the operation of the DRAM of Embodiment 3.

The operation of the DRAM of this embodiment will now be described referring to FIG. 17. In the halt period, the potential of the word line WL is 0 V, and the potential of the bit line BL is an intermediate potential (½·Vcc=1.8 V). Therefore, the gate voltage Vg of the memory cell transistor 4' is 0 V, and the potential of the first electrode (q) is the intermediate potential (=1.8 V). Also, in the halt period, the potential of the cell plate node 3 is increased from the low potential Vcp1 (=1.8 V) to the high potential Vcp2 (=3.6 V). Therefore, the potential of the charge storage node 1 is also increased by the increase amount of the potential of the cell plate node 3 (i.e., 1.8 V) owing to the capacity coupling of the memory cell capacitor 5. At the initial stage of the transition to the halt period, the potential of the charge storage node 1 storing a high data is 5.4 V (=a supply potential (Vcc=3.6 V)+increased potential (=1.8 V)), and the potential of the charge storage node 1 storing a low data is 1.8 V (=the predetermined potential (0 V)+increased potential (=1.8 V)).

In the case where it is assumed that the potential of the cell plate node 3 is not controlled to increase, when the charge storage node 1 stores a low data, the second electrode (t) (the charge storage node 1) having a lower potential works as a source and the gate-source voltage Vgs of the memory cell transistor 4' becomes 0 V. Therefore, the memory cell transistor 4' is in a weak off state. This is a state where a large amount of a leakage current flows from the bit line BL through the transistor 4' to the charge storage node 1. In this embodiment, however, since the potential of the cell plate node 3 is controlled to increase so as to increase the potential of the charge storage node 1 to 1.8 V as described above. Therefore, the gate-source voltage Vgs of the memory cell transistor 4' becomes the negative voltage (=−1.8 V), and hence, the memory cell transistor 4' is in a strong off state. Thus, the amount of a leakage current I3R flowing from the bit line BL through the memory cell transistor 4' to the charge storage node 1 can be decreased (In this case, since the potential of the bit line BL (=1.8 V) is equal to the potential VSN (=1.8 V) of the charge storage node 1 and there is no potential difference between the first and second electrodes (q) and (t) of the memory cell transistor 4', the leakage current I3R is prevented from flowing).

When the charge storage node 1 stores a high data, the first electrode (q) having a lower potential works as a source and the gate-source voltage Vgs of the memory cell transistor 4' becomes the negative potential (=−1.8 V). Therefore, the memory cell transistor 4' is in a strong off state. Accordingly, the amount of a leakage current I3L flowing from the charge storage node 1 to the bit line BL is small.

In the subsequent refresh period, the potential Vcp of the cell plate node 3 is switched from the high potential Vcp2 (=3.6 V) to the normal low potential Vcp1 (=1.8 V). The potential VSN of the charge storage node 1 is decreased by approximately 1.8 V, and hence, the subsequent refresh operation is not affected.

In this manner, in this embodiment, the amount of a leakage current (off current) flowing from the bit line BL to the charge storage node 1 while the memory cell transistor 4' is off can be decreased, and the increase rate of the potential VSN in the charge storage node 1 storing a low data can be made smaller. Therefore, the retention time for a low data can be extended.

It is noted that the increased potential of the potential Vcp of the cell plate node 3 is not necessarily required to be 1.8 V as in this embodiment. In order to set another increased potential, however, an additional power voltage is required in addition to the supply voltage Vcc (=3.6 V) and the intermediate voltage ½·Vcc (=1.8 V).

(Embodiment 4)

Figure 18:
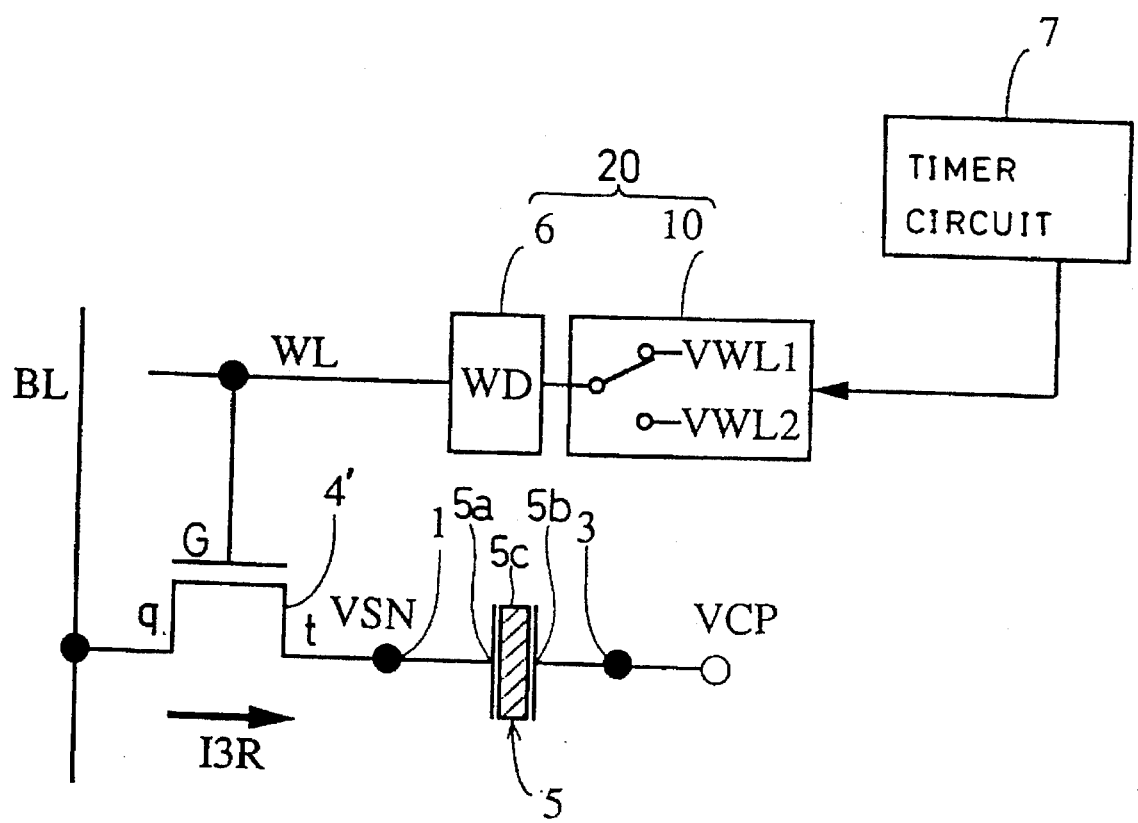
FIG. 18 is a circuit diagram of an equivalent circuit of the main part of a DRAM of Embodiment 4.

FIG. 18 shows Embodiment 4 of the invention. In the case where there is little or no need to deal with a leakage current flowing through a PN junction of a memory cell transistor like in the application of a memory cell transistor having the SOI structure, the off state of the transistor is enhanced by increasing the source voltage of the memory cell transistor so as to set the gate-source voltage Vgs thereof at the negative potential in Embodiment 3. In this embodiment, the gate voltage of the memory cell transistor is controlled to decrease so as to set the gate-source voltage Vgs at the negative potential, thereby enhancing the off state of the transistor.

In the DRAM of FIG. 18, the memory cell transistor 4' is formed as a transistor having the SOI structure as shown in FIG. 15. The cell plate node 3 is supplied with a predetermined cell plate potential Vcp (for example, of 1.8 V). This DRAM has substantially the same configuration as that of FIG. 3 except for the above. The word driver circuit 6 of FIG. 18 sets the potential of an unselected word line WL at the normal potential VWL1 (=0 V) in the refresh period during the standby time and at the negative potential VWL2 (=−1.5 V) in the halt period as in Embodiment 1.

Figure 19:
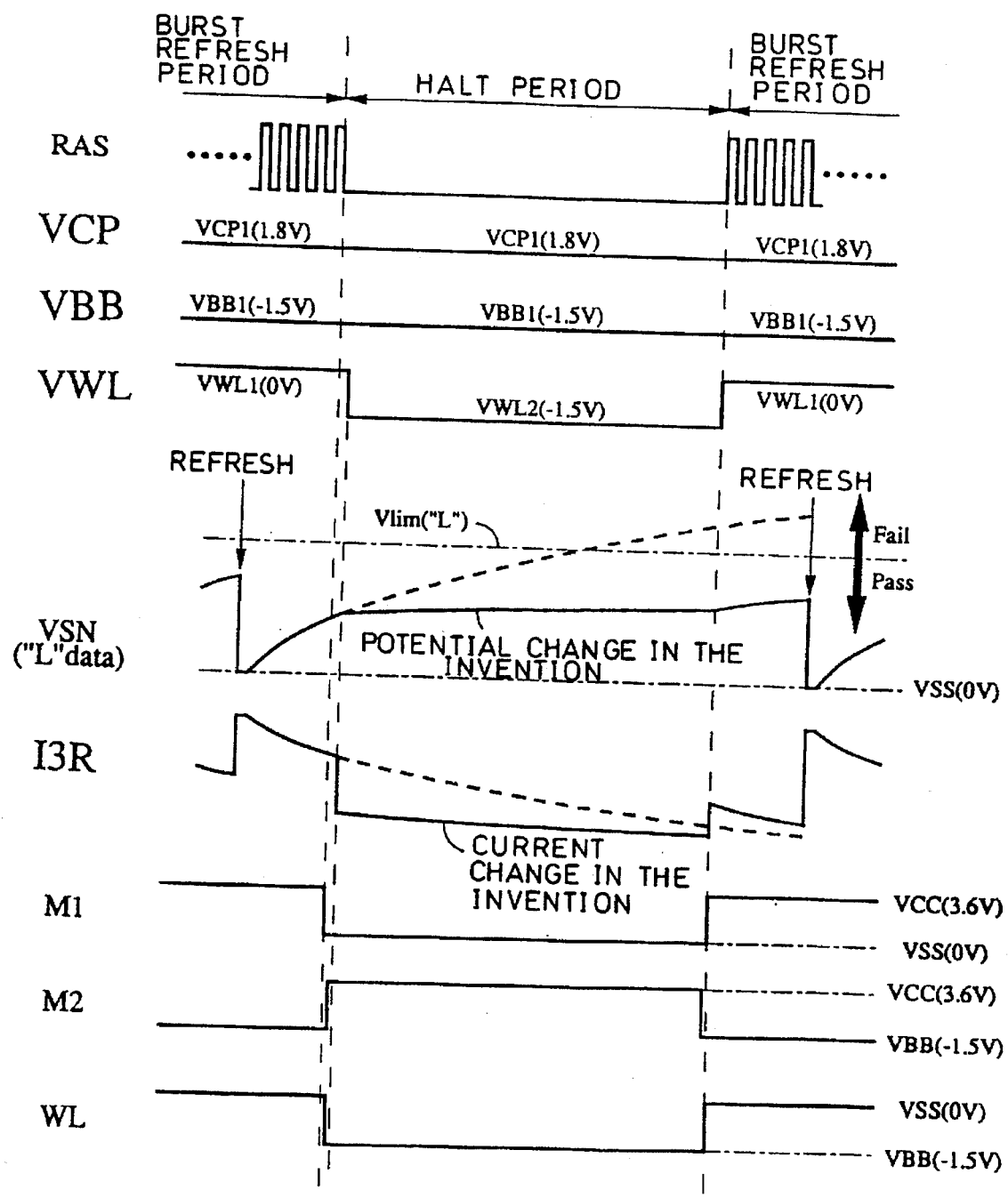
FIG. 19 is a waveform diagram for showing the operation of the DRAM of Embodiment 4.

Therefore, in this embodiment, in the halt period during the standby time, the gate potential of the memory cell transistor 4' is set at the potential of the word line WL, i.e., the negative potential VWL2 (=−1.5 V). The potential of the bit line BL is the intermediate potential (½·Vcc=1.8 V). At the initial stage of the halt period, the potential of the charge storage node 1 storing a high data is the supply potential Vcc (=3.6 V), and that of the charge storage node 1 storing a low data is 0 V. Therefore, no matter whether the charge storage node 1 stores a high or low data, the gate-source voltage Vgs of the memory cell transistor 4' is the negative potential, thereby enhancing the off state of the memory cell transistor 4'. As a result, as is shown in FIG. 19, a leakage current I3R flowing from the bit line BL through the memory cell transistor 4' to the charge storage node 1 and a leakage current I3L flowing in the reverse direction can be both suppressed. Thus, the retention time for both a high data and a low data can be effectively extended.

(Embodiment 5)

Figure 20:
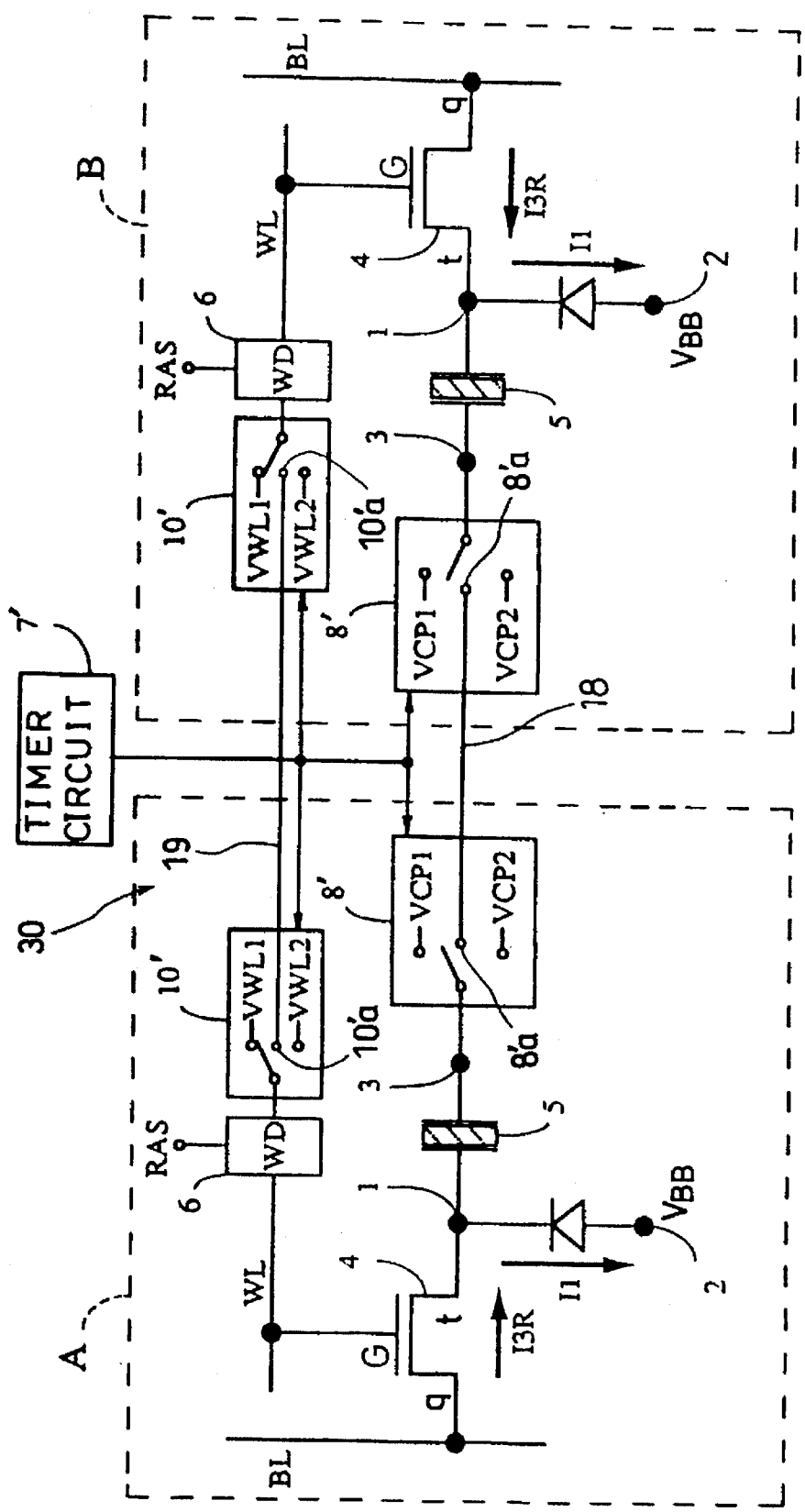
FIG. 20 is a circuit diagram of an equivalent circuit of the main part of a DRAM of Embodiment 5.

FIG. 20 shows Embodiment 5 of the invention. In this embodiment, the configuration shown in FIG. 3 is provided to at least each of a first group A and a second group B. A timer circuit 7' is commonly used by the groups A and B. When the timer circuit (timing control circuit) 7' outputs a period signal corresponding to the refresh period to the first group A during the standby time, it outputs a period signal corresponding to the halt period to the second group B. On the contrary, when the first group A is supplied with a period signal corresponding to the halt period, the second group B is supplied with a period signal corresponding to the refresh period. Accordingly, while the first group A is conducting a refresh operation, the second group B is completely halted, and while the second group B is conducting a refresh operation, the first group A is completely halted.

A cell plate node potential switching circuit 8' in each of the groups A and B includes a switching circuit 8'a connected to a cell plate node 3 included in the same group. The switching circuits 8'a in the respective groups are connected to each other through a connection circuit 18. The respective switching circuits 8'a are closed in transition time between a refresh period and a halt period.

Similarly, a word line potential switching circuit 10' in each of the groups A and B includes a switching circuit 10'a connected to the cell plate node 3 therein. The switching circuits 10'a in the respective groups are connected to each other through a connection circuit 19. The respective switching circuits 10'a are closed in transition time between a refresh period and a halt period.

Accordingly, when one of the groups (for example, the first group A) is in the refresh period, the cell plate node 3 in the first group A has a normal potential Vcp1 (=1.8 V) and the word line WL therein has a normal potential VWL1 (=0 V). At this point, the other group (the second group B) is in the halt period, and hence, the cell plate node 3 in the second group B has a low potential Vcp2 (=0 V) and the word line WL therein has a low potential VWL2 (=−1.5 V).

Figure 21:
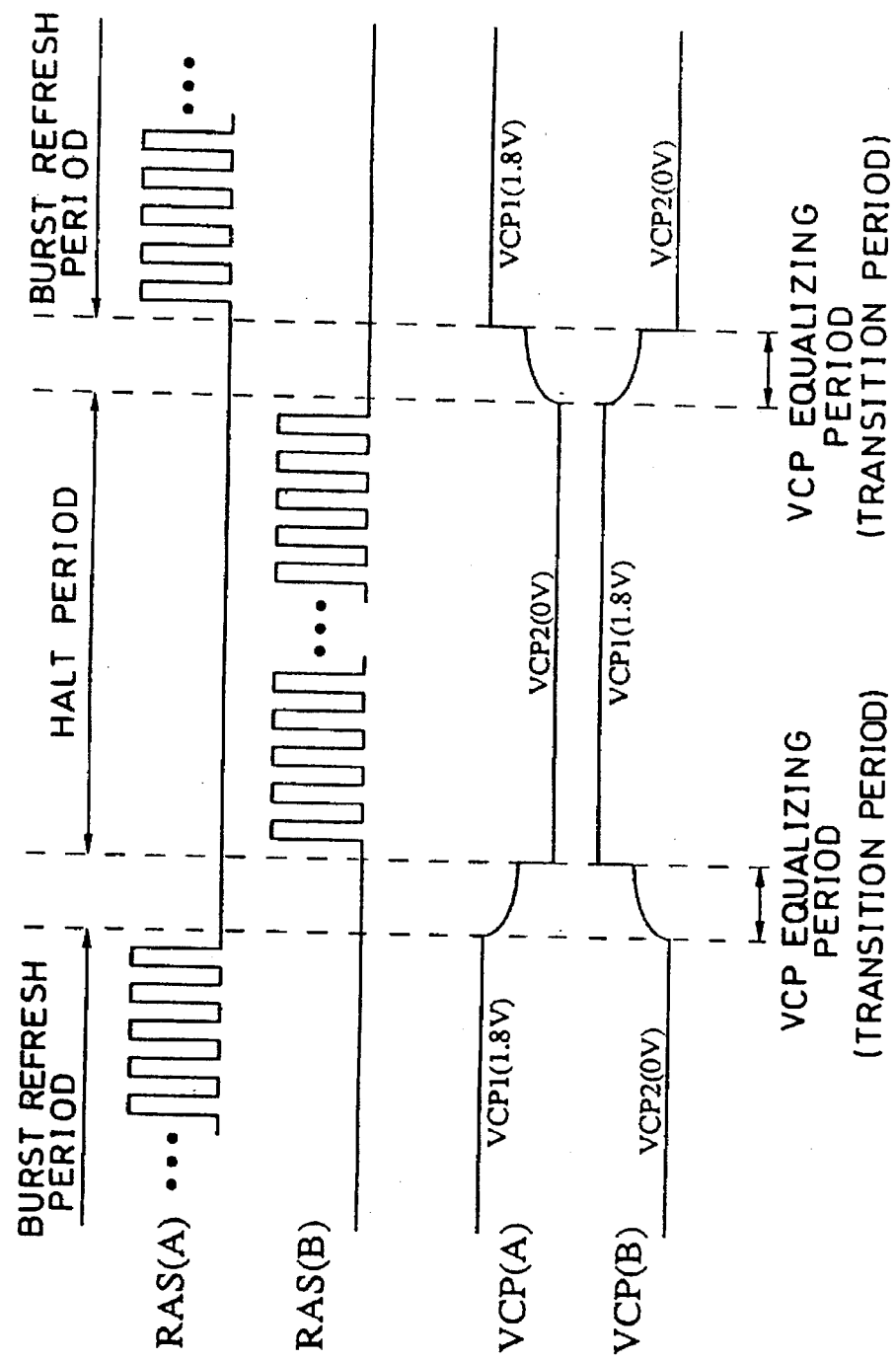
FIG. 21 is a waveform diagram for showing timing control in Embodiment 5.

When the first group A shifts from the refresh period to the halt period, that is, when the second group B shifts from the halt period to the refresh period, the potential of the cell plate node 3 in the first group A is switched from the normal potential Vcp1 (=1.8 V) to the low potential Vcp2 (=0 V), and the potential of the cell plate node 3 in the second group B is switched from the low potential Vcp2 (=0 V) to the normal potential Vcp1 (=1.8 V). Also, the potential of the word line WL in the first group A is switched from the normal potential VWL1 (=0 V) to the low potential VWL2 (=−1.5 V), and the potential of the word line WL in the second group B is switched from the low potential VWL2 (=−1.5 V) to the normal potential VWL1 (=0 V). At this point, the switching circuits 8'a and 10'a of the respective potential switching circuits 8' and 10' are closed, so that the cell plate nodes 3 and the word lines WL in the groups A and B are mutually connected, respectively. Therefore, as is shown in FIG. 21, the charge of the memory cell capacitor 5 in the first group A is supplied to the memory cell capacitor 5 in the second group B, and the charge of the word line WL in the first group A is supplied to the word line WL in the second group B. Thus, the charges can be reused, resulting in decreasing power consumption required for increasing the potentials of the memory cell capacitor 5 or the word line WL. A combination of the switching circuit 8'a of the cell plate node potential switching circuit 8' and the connection circuit 18 in each group, and a combination of the switching circuit 10'a of the word line potential switching circuit 10' and the connection circuit 19 in each group form charge redistribution means 30.

Figure 22:
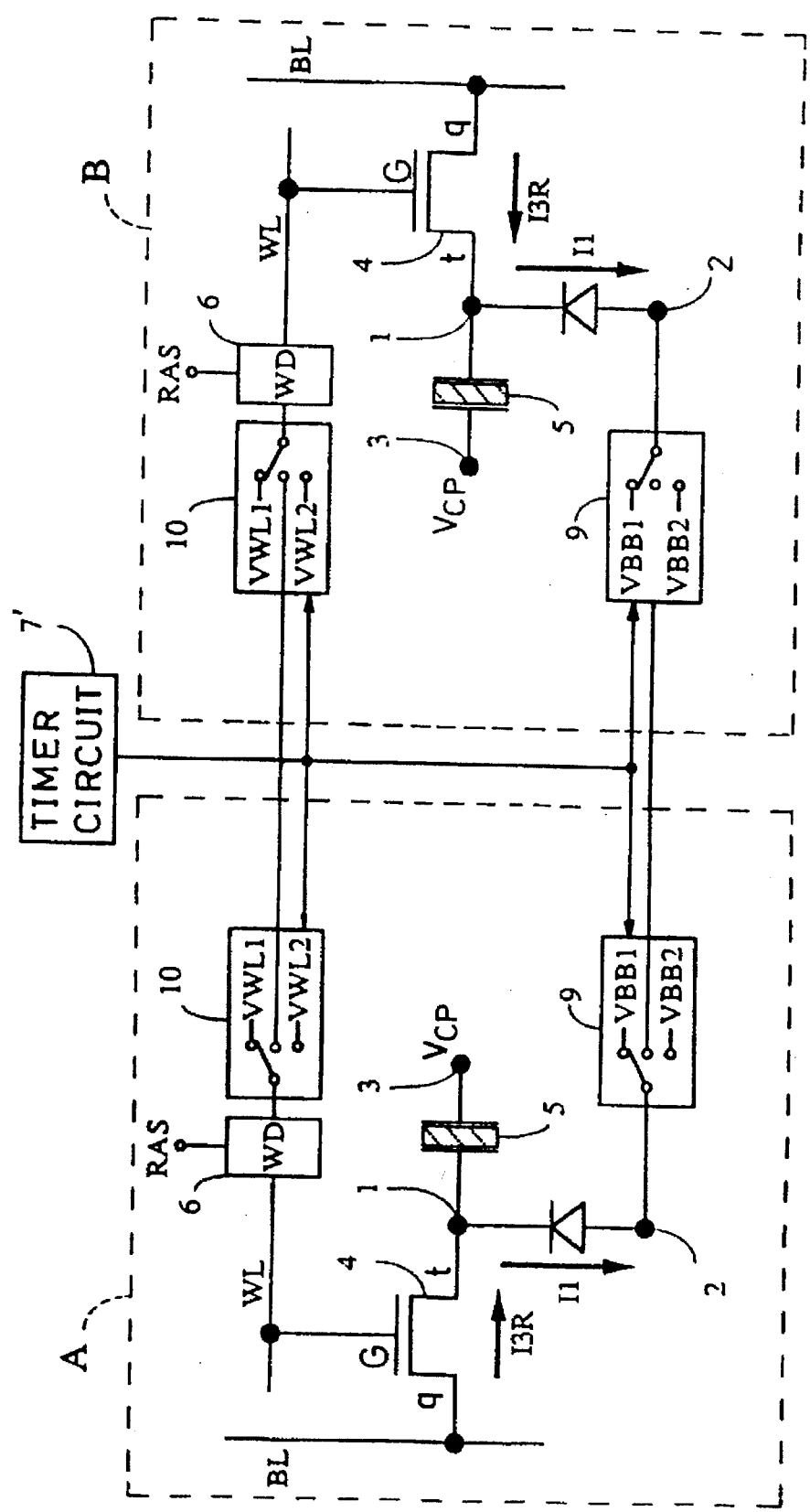
FIG. 22 is a circuit diagram of an equivalent circuit of the main part of a DRAM formed by applying Embodiment 5 to the configuration of Embodiment 2.
Figure 23:
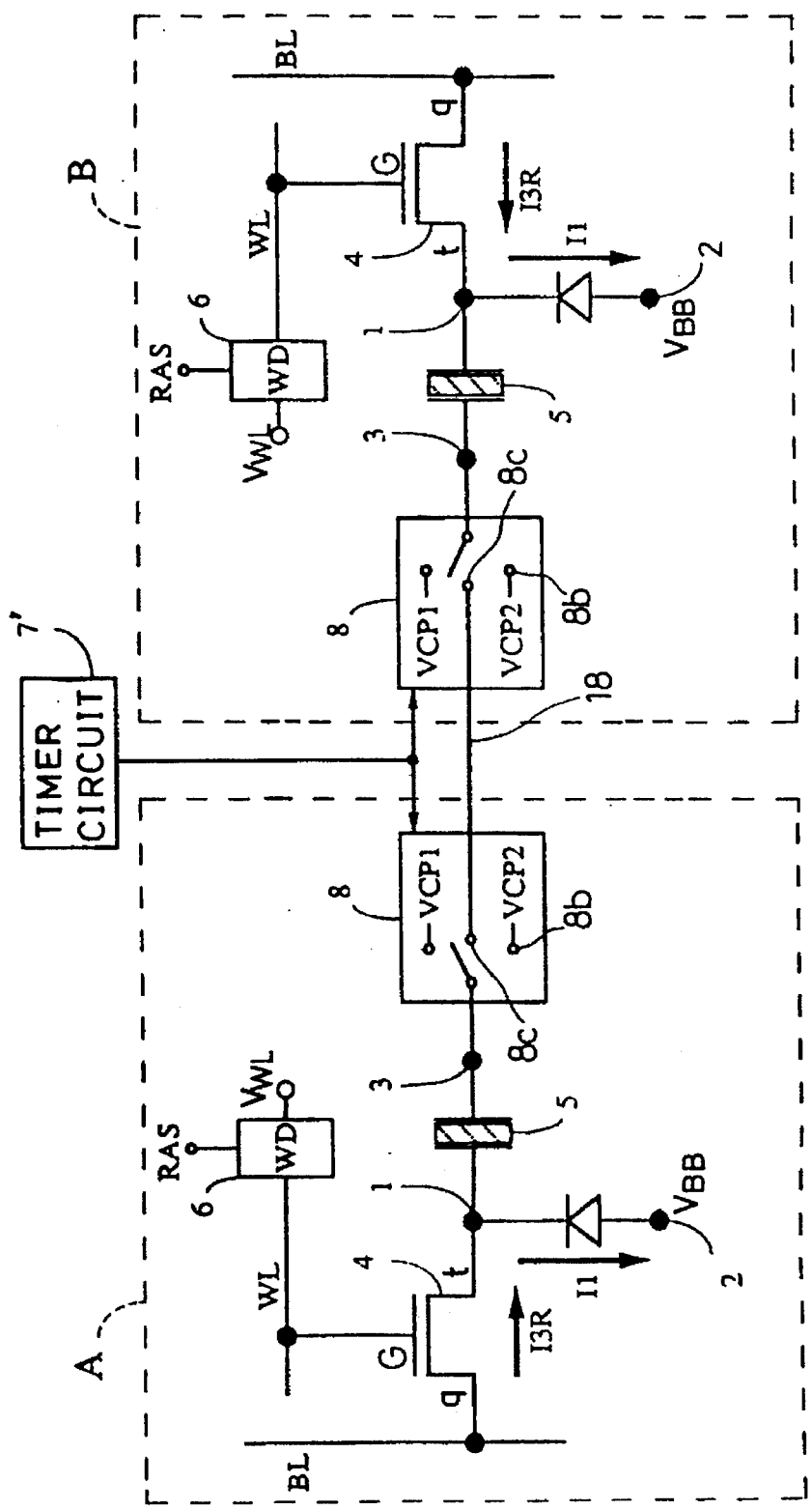
FIG. 23 is a circuit diagram of an equivalent circuit of the main part of a DRAM formed by applying Embodiment 5 to the configuration of Embodiment 3.
Figure 24:
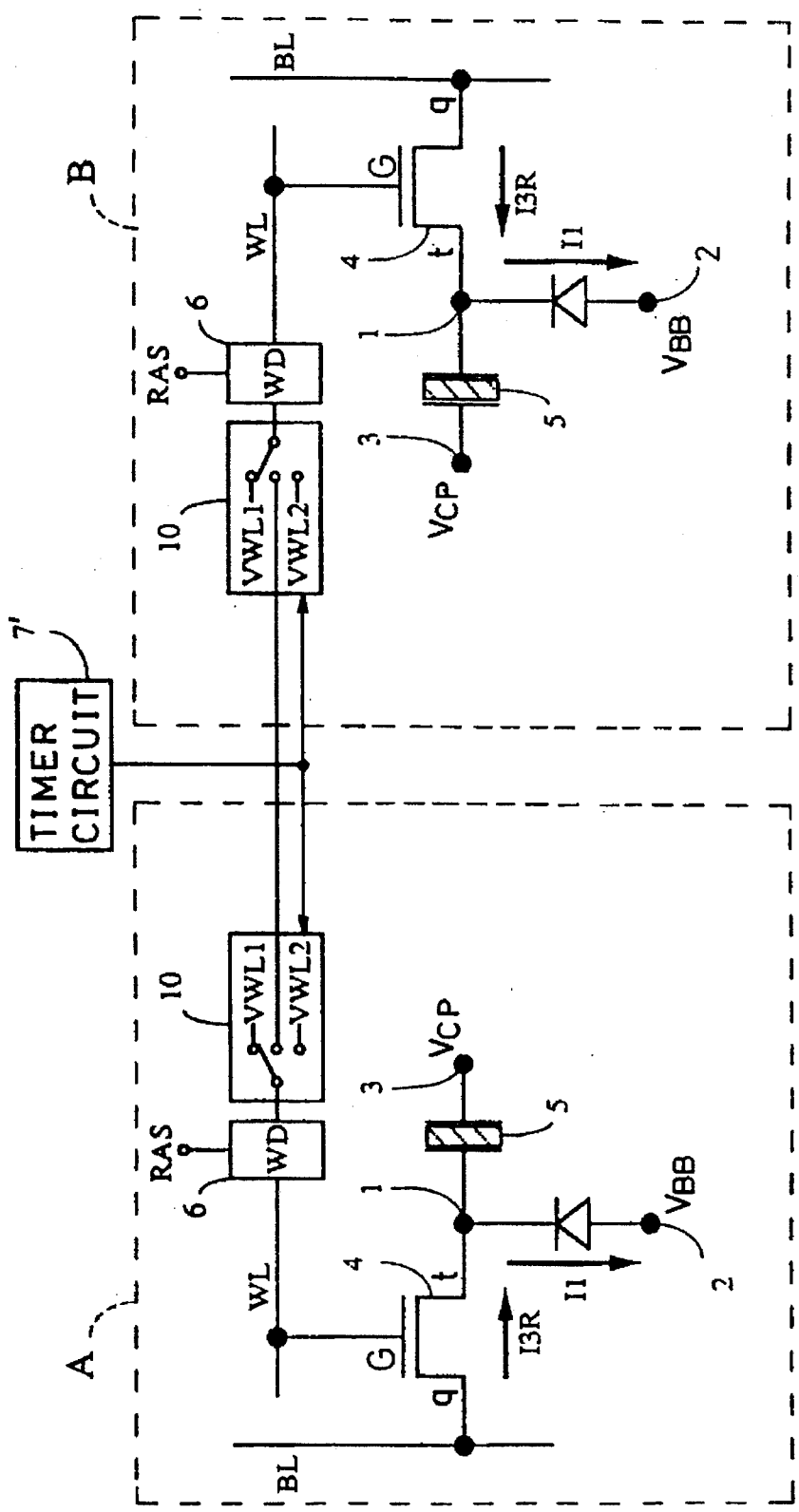
FIG. 24 is a circuit diagram of an equivalent circuit of the main part of a DRAM formed by applying Embodiment 5 to the configuration of Embodiment 4.
Figure 25:
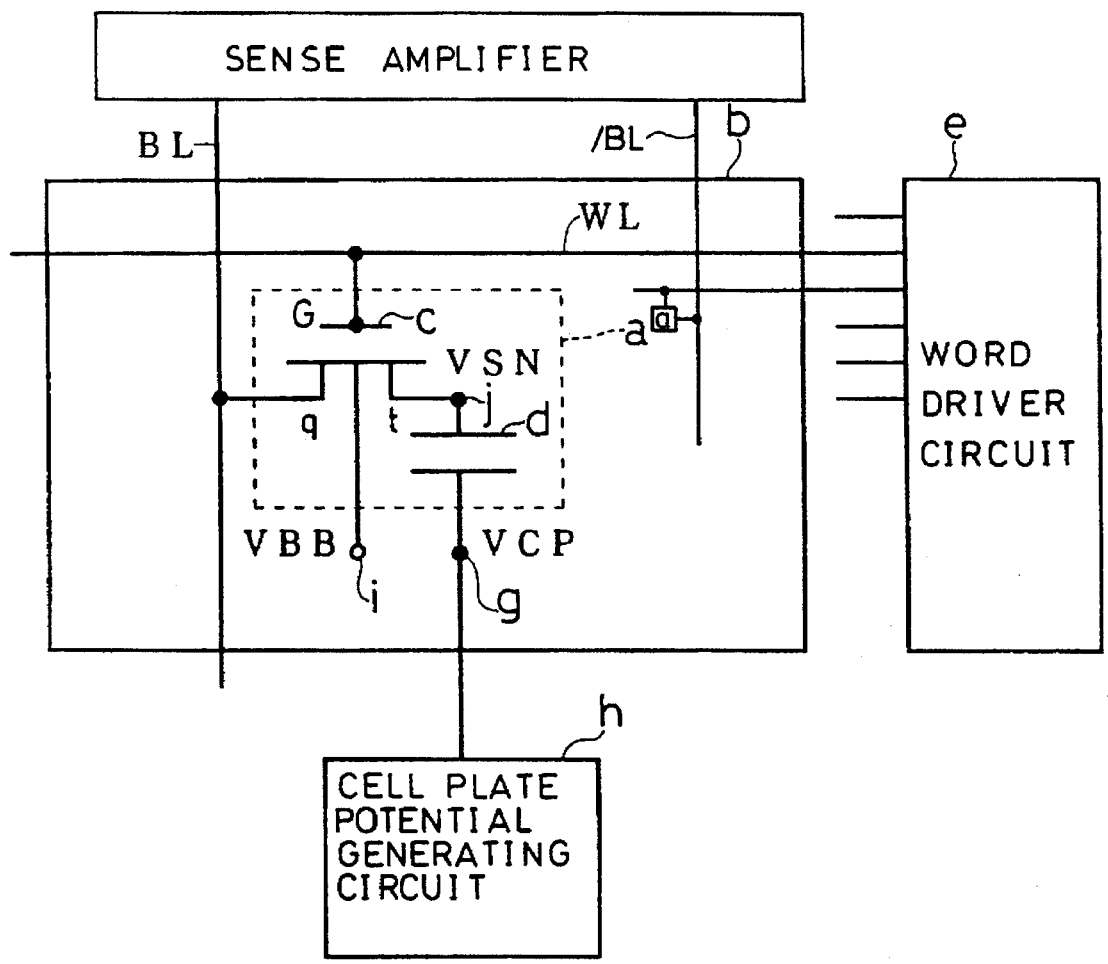
FIG. 25 shows the main part configuration of a conventional DRAM.
Figure 26:
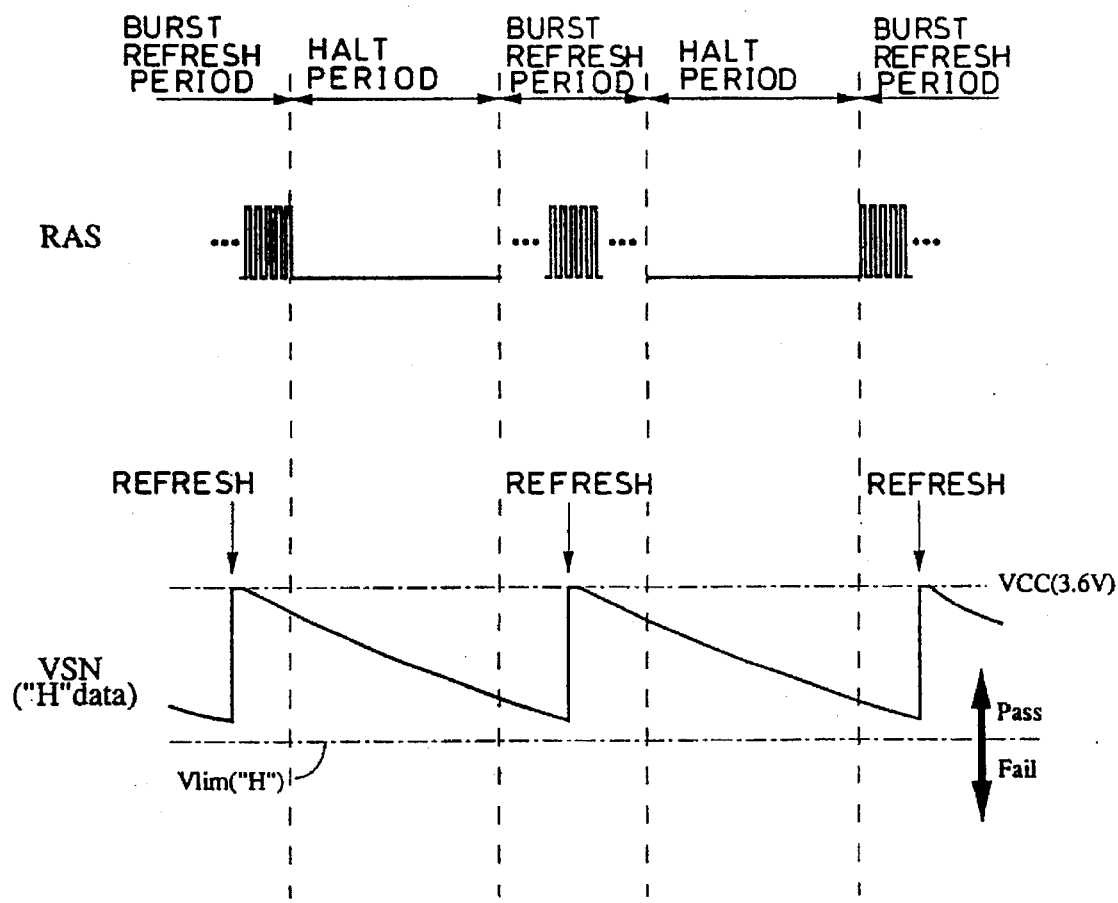
FIG. 26 is a waveform diagram for showing the operation of the conventional DRAM.
Figure 27:
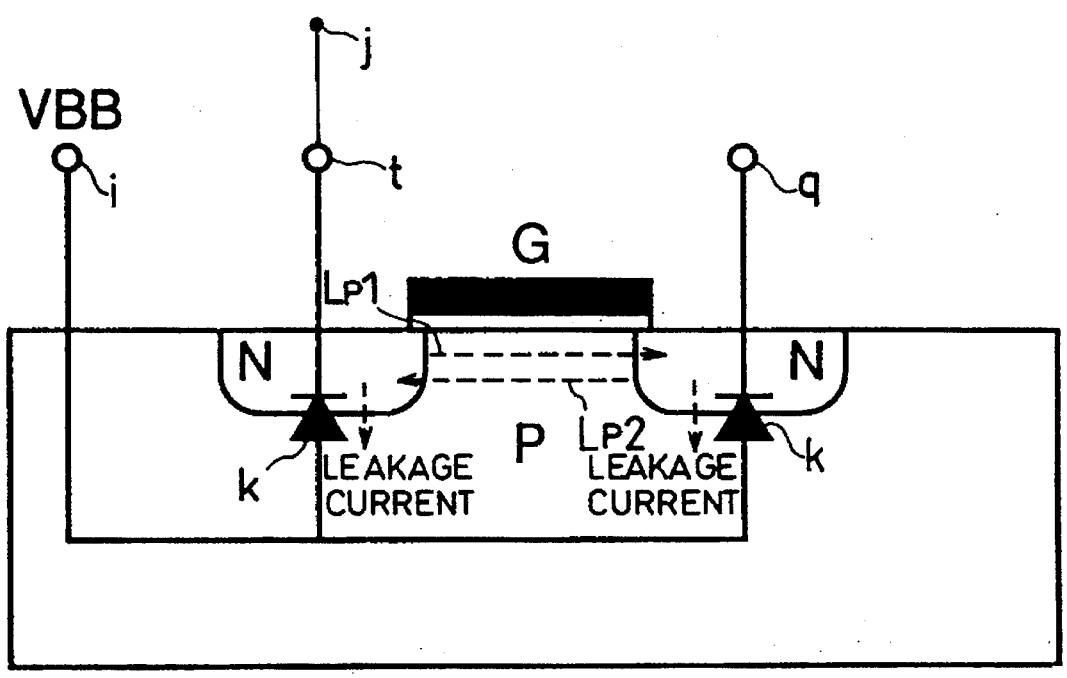
FIG. 27 is schematic diagram showing a leakage current path through a PN junction in a conventional NMOS transistor.

In this embodiment, the configuration of Embodiment 1 is applied to the reuse of the charge in the groups A and B. It is, however, needless to say that the charge can be effectively reused also in the configuration shown in FIG. 22 where Embodiment 2 is applied, that shown in FIG. 23 where Embodiment 3 is applied and that shown in FIG. 24 where Embodiment 4 is applied.

What is claimed is:

1. An apparatus for extending data retention time of a semiconductor storage circuit comprising a plurality of memory cells, each memory cell including a capacitor having a first electrode and a second electrode with an insulator sandwiched therebetween and a memory cell transistor having a control electrode and other two electrodes disposed on a substrate, the second electrode of the capacitor being connected to a cell plate, the first electrode of the capacitor being connected to one of the two electrodes of the memory cell transistor, a node between the first electrode of the capacitor and the electrode of the memory cell transistor serving as a charge storage node, the other of the two electrodes of the memory cell transistor being connected to a bit line, a PN junction being formed between the charge storage node and the substrate, wherein a predetermined amount of charge is stored in the charge storage node of at least one of the memory cells in a first period during standby time and storage of the charge is halted in a second period during the standby time, and the apparatus is further provided with:

a cell plate potential switching circuit having an output terminal connected to the cell plate for setting a potential of the cell plate, in the first period, at a predetermined potential, and in the second period, at a potential which makes smaller a potential difference between both ends of the PN junction than that in the first period, and an electrode potential switching circuit connected to the control electrode of the memory cell transistor for setting a potential of the control electrode, in the first period, at a set potential, and in the second period, at a potential which enhances an off state of the memory cell transistor, so as to suppress a leakage current flowing through the PN junction and an off current flowing through the memory cell transistor during the standby time.

2. The apparatus of claim 1, wherein the memory cell transistor includes an NMOS transistor, the control electrode of the memory cell transistor is connected to a word line, and the electrode potential switching circuit includes:

a word driver circuit for changing a potential of the word line between a potential for operation and that for standby, and a word line potential switching circuit for further setting the potential of the word line that has changed by the word driver circuit, in the first period, at the set potential, and in the second period, at a low potential that is lower than the set potential, so as to enhance the off state of the memory cell transistor.

3. The apparatus of claim 2, wherein the word line potential switching circuit includes first and second transistors connected in parallel to each other, and the first transistor is supplied with a ground potential and turned on in the first period so as to supply the ground potential to the word driver circuit, and the second transistor is supplied with the low potential and turned on in the second period so as to supply the low potential to the word driver circuit.

4. The apparatus of claim 1, further comprising:

a timer circuit for distinguishing the first period and the second period during the standby time, and outputting a period signal to the cell plate potential switching circuit and the electrode potential switching circuit.

5. The apparatus of claim 1, wherein a potential of the substrate is set at a negative potential, and the cell plate potential switching circuit changes, in the second period, the potential of the cell plate to a low potential that is lower than the predetermined potential, so as to make smaller the potential difference between the both ends of the PN junction than that in the first period.

6. The apparatus of claim 5, further comprising:

a first cell plate potential generating circuit connected to the cell plate potential switching circuit for generating the predetermined potential, a second cell plate potential generating circuit for generating the low potential and supplying the low potential to the cell plate potential switching circuit, and a diode disposed between the first cell plate potential generating circuit and the cell plate potential switching circuit and including an NMOS or a PMOS transistor for supplying the cell plate potential switching circuit with a potential obtained by slightly decreasing the predetermined potential generated by the first cell plate potential generating circuit.

7. The apparatus of claim 5, further comprising:

a first cell plate potential generating circuit for generating the predetermined potential and supplying the predetermined potential to the cell plate potential switching circuit, a second cell plate potential generating circuit connected to the cell plate potential switching circuit for generating the low potential, and a diode disposed between the second cell plate potential generating circuit and the cell plate potential switching circuit and including an NMOS or a PMOS transistor for supplying the cell plate potential switching circuit with a potential obtained by slightly increasing the low potential generated by the second cell plate potential generating circuit.

8. The apparatus of claim 1, wherein the bit line is precharged to a supply potential or a half of the supply potential in the second period.

9. The apparatus of claim 1, wherein the memory cell transistor includes an NMOS transistor, the control electrode of the memory cell transistor is connected to a word line, the electrode potential switching circuit includes a word driver circuit for changing a potential of the word line between a potential for operation and that for standby, and the word driver circuit sets, always during the standby time, the potential of the word line at a low potential which is lower than the predetermined potential, so as to enhance the off state of the memory cell transistor.

10. The apparatus of claim 9, wherein the word driver circuit includes:

a word drive line and a wire supplied with the low potential, a drive control transistor for connecting the word drive line to the word line, a negative potential control transistor for connecting the wire to the word line, a first transistor for turning on the drive control transistor and turning off the negative potential control transistor when a predetermined node has a predetermined high potential, and second and third transistors for connecting the predetermined node to the negative control transistor in the second period, and each threshold voltage of the negative potential control transistor and the second transistor is set at a predetermined voltage which is larger than a potential difference between the ground potential and the negative potential, and driving ability of the second transistor is set to be smaller than that of the third transistor.

11. The apparatus of claim 1, wherein the plural memory cells are divided into at least a first group and a second group, and the apparatus is further provided with:
- a timing control circuit for causing transition of the second group from the second period to the first period after transition of the first group from the first period to the second period, and
- charge redistribution means for, during the time till the transition of the second group from the second period to the first period after the transition of the first group from the first period to the second period, connecting the second electrode of the capacitor of the memory cell belonging to the first group to the second electrode of the capacitor of the memory cell belonging to the second group, so as to reuse charge between the second electrodes, and for connecting the control electrode of the memory cell transistor belonging to the first group to the control electrode of the memory cell transistor belonging to the second group, so as to reuse charge between the control electrodes.

12. An apparatus for extending data retention time of a semiconductor storage circuit comprising a plurality of memory cells, each of the memory cells including a capacitor having a first electrode and a second electrode with an insulator sandwiched therebetween and a memory cell transistor having a control electrode and other two electrodes disposed on a substrate, the first electrode of the capacitor being connected to one of the two electrodes of the memory cell transistor, a node between the first electrode of the capacitor and the electrode of the memory cell transistor serving as a charge storage node, the other of the two electrodes of the memory cell transistor being connected to a bit line, a PN junction being formed between the charge storage node and the substrate, wherein a predetermined amount of charge is stored in the charge storage node of at least one of the memory cells in a first period during standby time and storage of the charge is halted in a second period during the standby time, and the apparatus is further provided with:
- a substrate potential switching circuit having an output terminal connected to the substrate of the memory cell transistor for setting a potential of the substrate, in the first period, at a predetermined potential and in the second period, at a potential which makes smaller a potential difference between both ends of the PN junction than that in the first period, and
- an electrode potential switching circuit connected to the control electrode of the memory cell transistor for setting a potential of the control electrode, in the first period, at a set potential and in the second period, at a potential which enhances an off state of the memory cell transistor, so as to suppress a leakage current flowing through the PN junction and an off current flowing through the memory cell transistor during the standby time.

13. The apparatus of claim 12, wherein the substrate potential switching circuit sets the potential of the substrate at a predetermined negative potential in the first period, and changes the potential of the substrate to a high potential that is higher than the negative potential in the second period, so as to make smaller the potential difference between the both ends of the PN junction than that in the first period, and the electrode potential switching circuit sets the potential of the control electrode of the memory cell transistor at the set potential in the first period, and in the second period, at a low potential that is lower than the set potential, so as to enhance the off state of the memory cell transistor.

14. A method of extending data retention time of a semiconductor storage circuit, wherein a potential of a gate of an NMOS memory cell transistor is set at a high potential in a first period during standby time so as to turn on the memory cell transistor, thereby transferring charge stored in a charge storage node disposed between the memory cell transistor and a capacitor to a bit line, and charge of the bit line is amplified by a sense amplifier, so that the amplified charge of the bit line be re-charged in the charge storage node via the memory cell transistor, and in a second period during the standby time, a potential of a substrate of the memory cell transistor is increased so as to make small a potential difference between both ends of a PN junction formed between the charge storage node and the substrate of the memory cell transistor, and the potential of the gate of the memory cell transistor is changed from the high potential to a predetermined low potential, thereby enhancing an off state of the memory cell transistor.

15. An apparatus for extending data retention time of a semiconductor storage circuit comprising a plurality of memory cells, each of the memory cells including a capacitor having a first electrode and a second electrode with an insulator sandwiched therebetween and a memory cell transistor having a control electrode and other two electrodes disposed on a substrate, the second electrode of the capacitor being connected to a cell plate, the first electrode of the capacitor being connected to one of the two electrodes of the memory cell transistor, a node between which serves as a charge storage node, the other of the two electrodes of the memory cell transistor being connected to a bit line, wherein a predetermined amount of charge is stored in the charge storage node of at least one of the memory cells in a first period during standby time and storage of the charge is halted in a second period during the standby time, so as to extend the data retention time of the charge storage node of the semiconductor storage circuit, and the apparatus is further provided with a cell plate potential switching circuit having an output terminal connected to the cell plate for setting a potential of the cell plate, in the first period, at a predetermined potential and in the second period, at a potential which enhances an off state of the memory cell transistor, so as to suppress an off current flowing through the memory cell transistor during the standby time.

16. The apparatus of claim 15, wherein the cell plate potential switching circuit sets the potential of the cell plate, in the first period, at the predetermined potential and in the second period, at a high potential that is higher than the predetermined potential, so as to enhance the off state of the memory cell transistor.

17. The apparatus of claim 15, wherein the memory cell transistor is formed out of a transistor having an SOI (silicon on insulator) structure including an insulator interposed between the control and other two electrodes and the substrate.

18. A method of extending data retention time of a semiconductor storage circuit, wherein a potential of a gate of an NMOS memory cell transistor is set at a high potential in a first period during standby time, so as to turn on the memory cell transistor, thereby transferring charge stored in a charge storage node disposed between the memory cell transistor and a capacitor to a bit line, and charge of the bit line is amplified by a sense amplifier, so that the amplified charge of the bit line be re-charged in the charge storage node via the memory cell transistor, and in a second period during the standby time, a potential of a cell plate connected to the capacitor is changed to be high, thereby enhancing an off state of the memory cell transistor.

19. An apparatus for extending data retention time of a semiconductor storage circuit comprising a plurality of memory cells, each of the memory cells including a capacitor having a first electrode and a second electrode with an insulator sandwiched therebetween and a memory cell transistor having a control electrode and other two electrodes disposed on a substrate, the first electrode of the capacitor being connected to one of the two electrodes of the memory cell transistor, a node between the first electrode of the capacitor and the electrode of the memory cell transistor serving as a charge storage node, the other of the two electrodes of the memory cell transistor being connected to a bit line, wherein a predetermined amount of charge is stored in the charge storage node of at least one of the memory cells in a first period during standby time, and storage of the charge is halted in a second period during the standby time, and the apparatus is further provided with an electrode potential switching circuit connected to the control electrode of the memory cell transistor for setting a potential of the control electrode, in the first period, at a set potential, and in the second period, at a potential which enhances an off state of the memory cell transistor, so as to suppress an off current flowing through the memory cell transistor during the standby time.

20. The apparatus of claim 19, wherein the electrode potential switching circuit sets the potential of the control electrode of the memory cell transistor, in the first period, at the set potential, and in the second period, at a low potential that is lower than the set potential, so as to enhance the off state of the memory cell transistor.

21. The apparatus of claim 19, wherein the memory cell transistor is formed out of a transistor having an SOI (silicon on insulator) structure including an insulator sandwiched between the control and other two electrodes and the substrate.

22. A method of extending data retention time of a semiconductor storage circuit, wherein a potential of a gate of an NMOS memory cell transistor is set at a high potential in a first period during standby time so as to turn on the memory cell transistor, thereby transferring charge stored in a charge storage node disposed between the memory cell transistor and a capacitor to a bit line, and charge of the bit line is amplified by a sense amplifier, so that the amplified charge of the bit line be re-charged in the charge storage node via the memory cell transistor, and in a second period during the standby time, a potential of a cell plate connected to the capacitor is decreased, so as to make small a potential difference between both ends of a PN junction formed between the charge storage node and a substrate of the memory cell transistor, and then the potential of the gate of the memory cell transistor is switched from the high potential to a predetermined low potential, so as to enhance an off state of the memory cell transistor.

23. A method of extending data retention time of a semiconductor storage circuit, wherein a potential of a gate of an NMOS memory cell transistor is set at a high potential in a first period during standby time, so as to turn on the memory cell transistor, thereby transferring charge stored in a charge storage node disposed between the memory cell transistor and a capacitor to a bit line, and charge of the bit line is amplified by a sense amplifier, so that the amplified charge of the bit line be re-charged in the charge storage node via the memory cell transistor, and in a second period during the standby time, the potential of the gate of the memory cell transistor is changed from the high potential to a predetermined low potential, thereby enhancing an off state of the memory cell transistor.

24. The apparatus of claim 1, 22, 12, 14, 15, 18, 19, 23 or 11, wherein the first period during the standby time is a period when an intensive refresh operation is conducted, and the second period during the standby time is a halt period when the intensive refresh operation is not conducted.

* * * * *